(12) United States Patent
Sakuma et al.

(10) Patent No.: US 8,779,502 B2
(45) Date of Patent: Jul. 15, 2014

(54) NONVOLATILE SEMICONDUCTOR MEMORY

(75) Inventors: Kiwamu Sakuma, Yokohama (JP);
Atsuhiro Kinoshita, Kamakura (JP);
Masahiro Kiyotoshi, Yokkaichi (JP);
Daisuke Hagishima, Kawasaki (JP);
Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/316,603

(22) Filed: Dec. 12, 2011

(65) Prior Publication Data
US 2012/0139030 A1 Jun. 7, 2012

Related U.S. Application Data

(63) Continuation of application No. PCT/JP2009/060803, filed on Jun. 12, 2009.

(51) Int. Cl.
*H01L 29/792* (2006.01)
*H01L 29/66* (2006.01)
*H01L 21/70* (2006.01)
*H01L 21/336* (2006.01)

(52) U.S. Cl.
USPC .... 257/324; 257/327; 257/390; 257/E21.679; 257/E27.103; 438/261

(58) Field of Classification Search
USPC .......... 257/324, 326, 390, E25.006, E21.679, 257/E27.103; 365/185.17; 438/261
See application file for complete search history.

(56) References Cited

U.S. PATENT DOCUMENTS

| 7,777,270 | B2 | 8/2010 | Kinoshita et al. |
| 8,008,732 | B2 | 8/2011 | Kiyotoshi et al. |
| 2004/0235262 | A1* | 11/2004 | Lee et al. ................. 438/411 |
| 2008/0073635 | A1* | 3/2008 | Kiyotoshi et al. ............ 257/2 |

(Continued)

FOREIGN PATENT DOCUMENTS

| JP | 2004-152893 | 5/2004 |
| JP | 2004-349702 | 12/2004 |

(Continued)

OTHER PUBLICATIONS

International Search Report mailed Aug. 25, 2009, with English translation, issued for PCT/JP2009/060803, filed Jun. 12, 2009.

(Continued)

*Primary Examiner* — Fernando L Toledo
*Assistant Examiner* — Aaron Gray
(74) *Attorney, Agent, or Firm* — Oblon, Spivak, McClelland, Maier & Neustadt, L.L.P.

(57) ABSTRACT

According to one embodiment, a nonvolatile semiconductor memory includes first to n-th (n is a natural number not less than 2) semiconductor layers in a first direction and extend in a second direction, and the semiconductor layers having a stair case pattern in a first end of the second direction, a common semiconductor layer connected to the first to n-th semiconductor layers commonly in the first end of the second direction, first to n-th layer select transistors which are provided in order from the first electrode side between the first electrode and the first to n-th memory strings, and first to n-th impurity regions which make the i-th layer select transistor (i is one of 1 to n) a normally-on state in the first end of the second direction of the i-th semiconductor layer.

23 Claims, 24 Drawing Sheets

(56) References Cited

U.S. PATENT DOCUMENTS

| | | |
|---|---|---|
| 2008/0157176 A1 | 7/2008 | Kim et al. |
| 2009/0309152 A1* | 12/2009 | Knoefler et al. ............. 257/324 |
| 2011/0272745 A1 | 11/2011 | Kiyotoshi et al. |

FOREIGN PATENT DOCUMENTS

| | | |
|---|---|---|
| JP | 2006-155750 | 6/2006 |
| JP | 2007-266143 | 10/2007 |
| JP | 2008-78404 | 4/2008 |
| JP | 2008-166759 | 7/2008 |
| JP | 2009-27136 | 2/2009 |
| JP | 2009-124107 | 6/2009 |

OTHER PUBLICATIONS

International Written Opinion mailed Aug. 25, 2009, issued for PCT/JP2009/060803, filed Jun. 12, 2009.
U.S. Appl. No. 13/218,868, filed Aug. 26, 2011, Kiyotoshi.
U.S. Appl. No. 13/366,845, filed Feb. 6, 2012, Kiyotoshi, et al.
U.S. Appl. No. 13/547,567, filed Jul. 12, 2012, Sakuma, et al.
U.S. Appl. No. 14/043,134, filed Oct. 1, 2013, Sakuma.

* cited by examiner

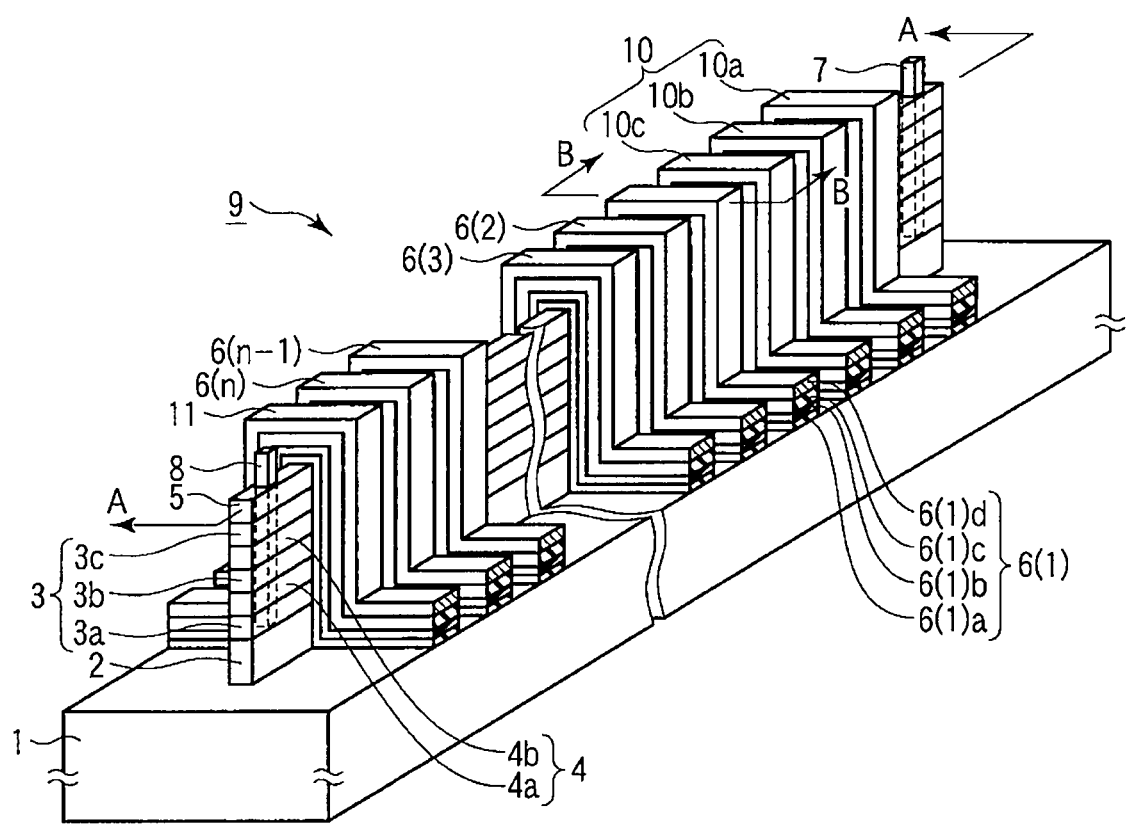
F I G. 1

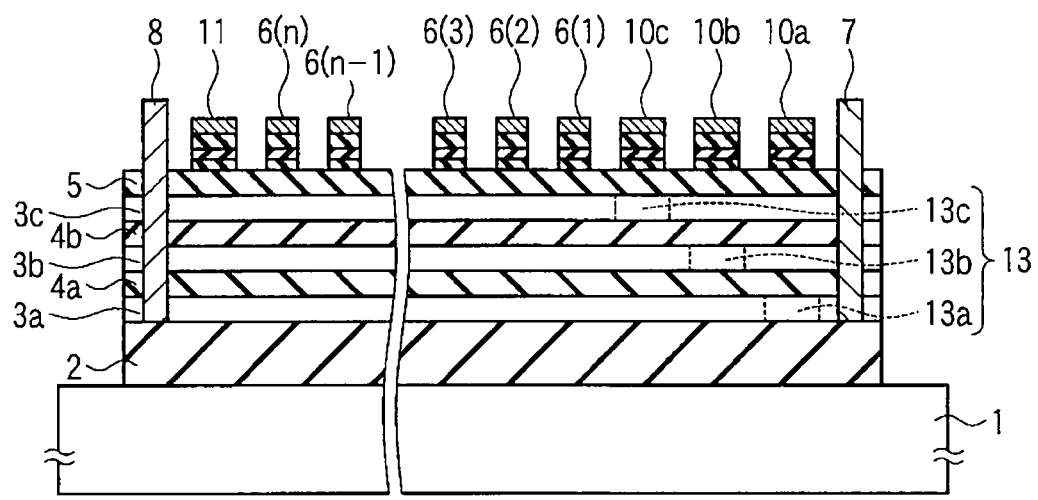
F I G. 2

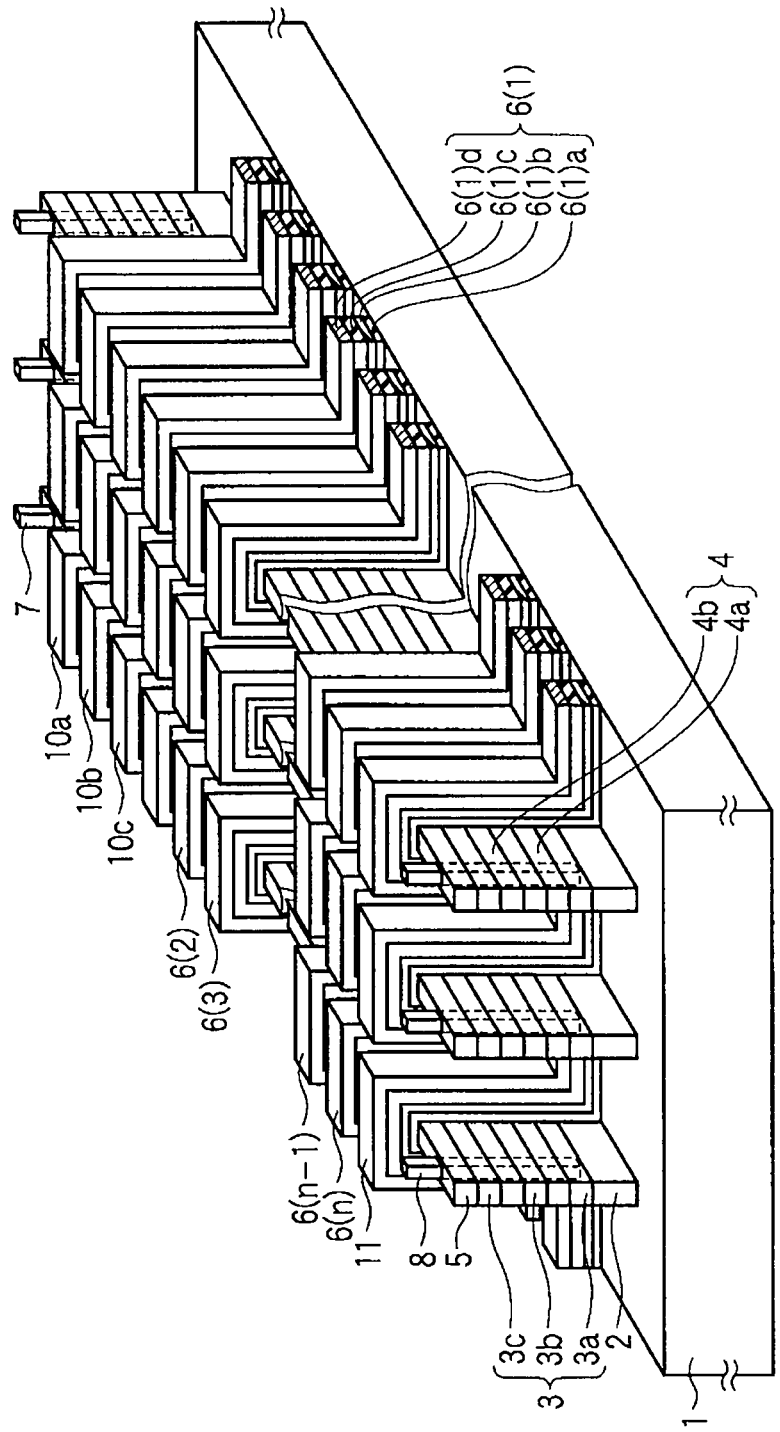
F I G. 3

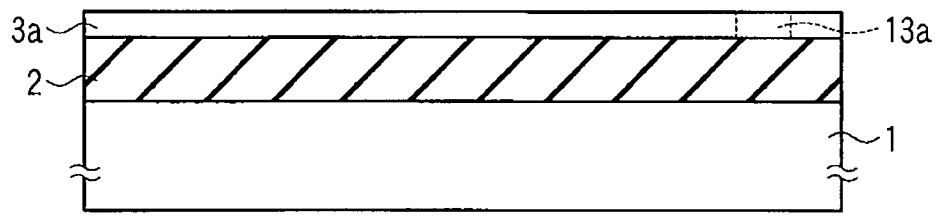
F I G. 4A
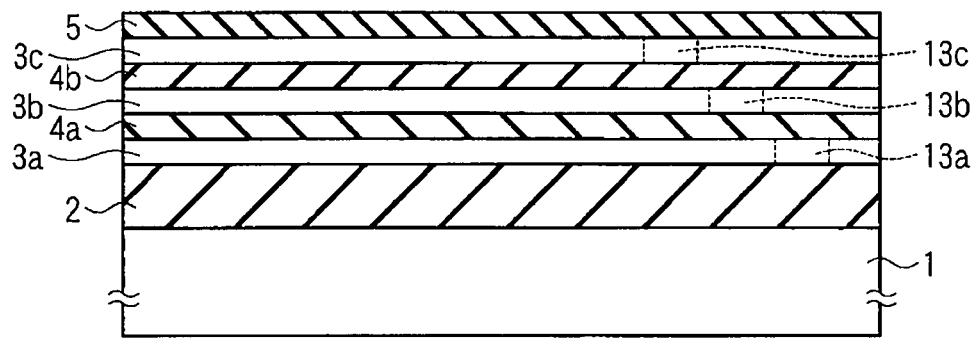
F I G. 4B

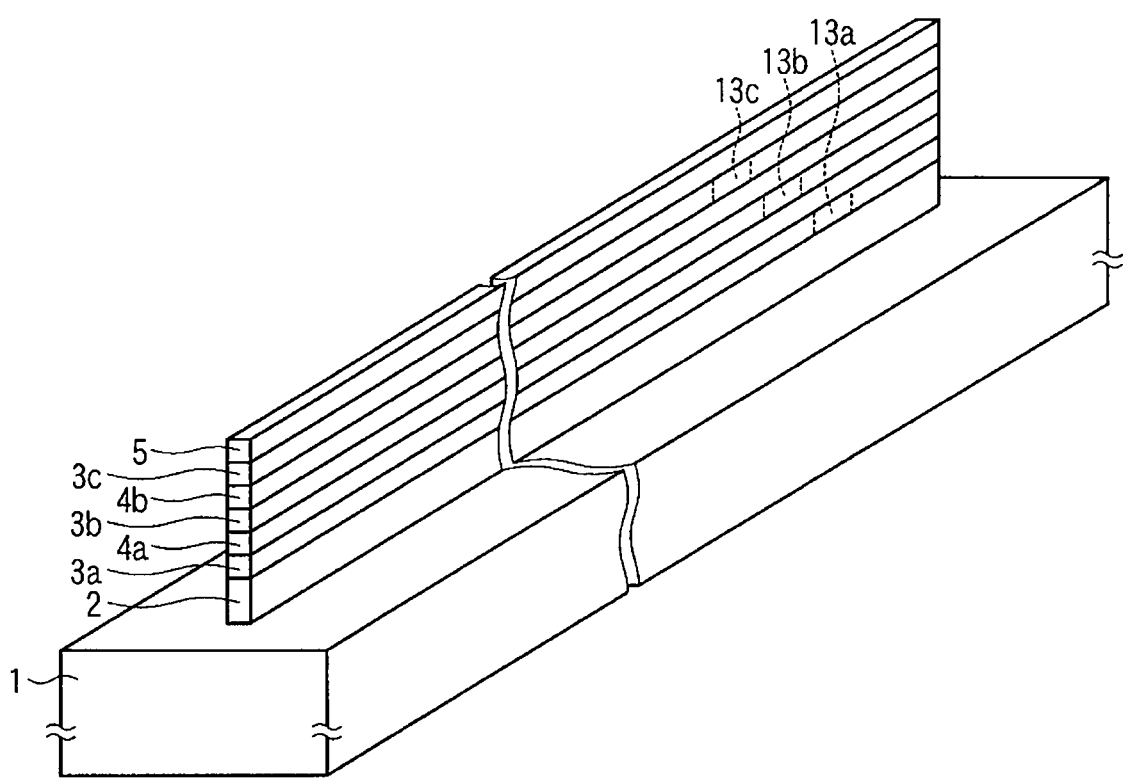
F I G. 4C
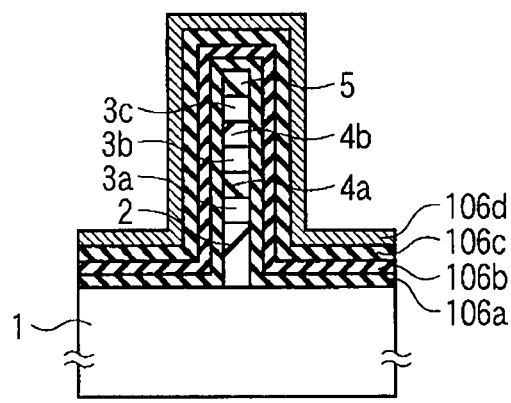
F I G. 4D

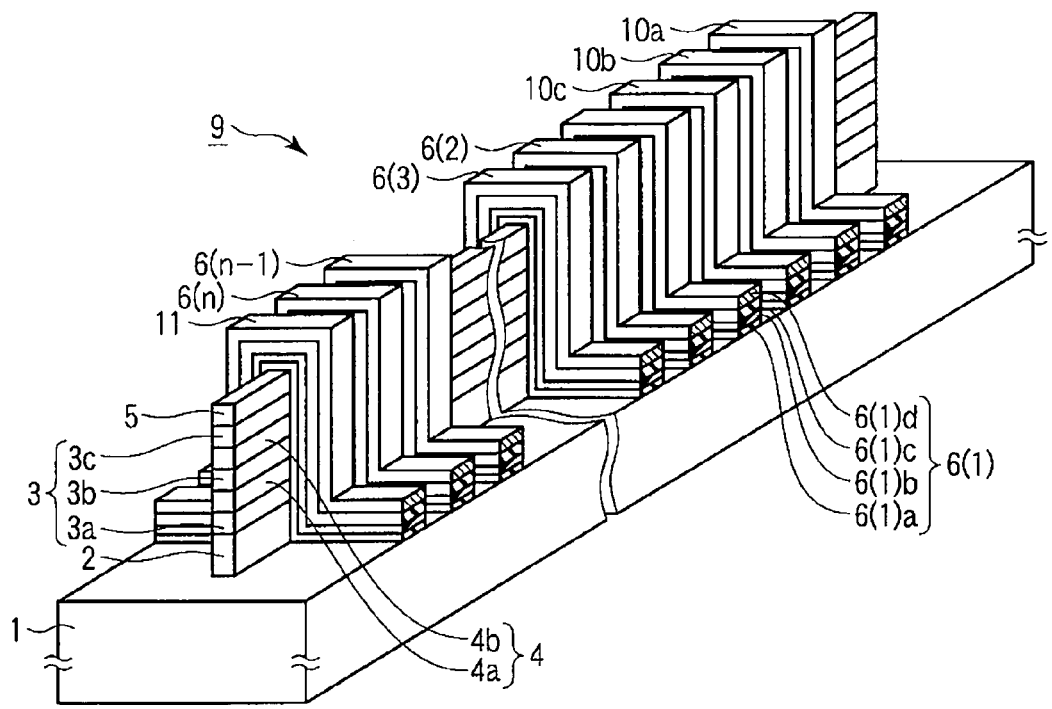
F I G. 4E
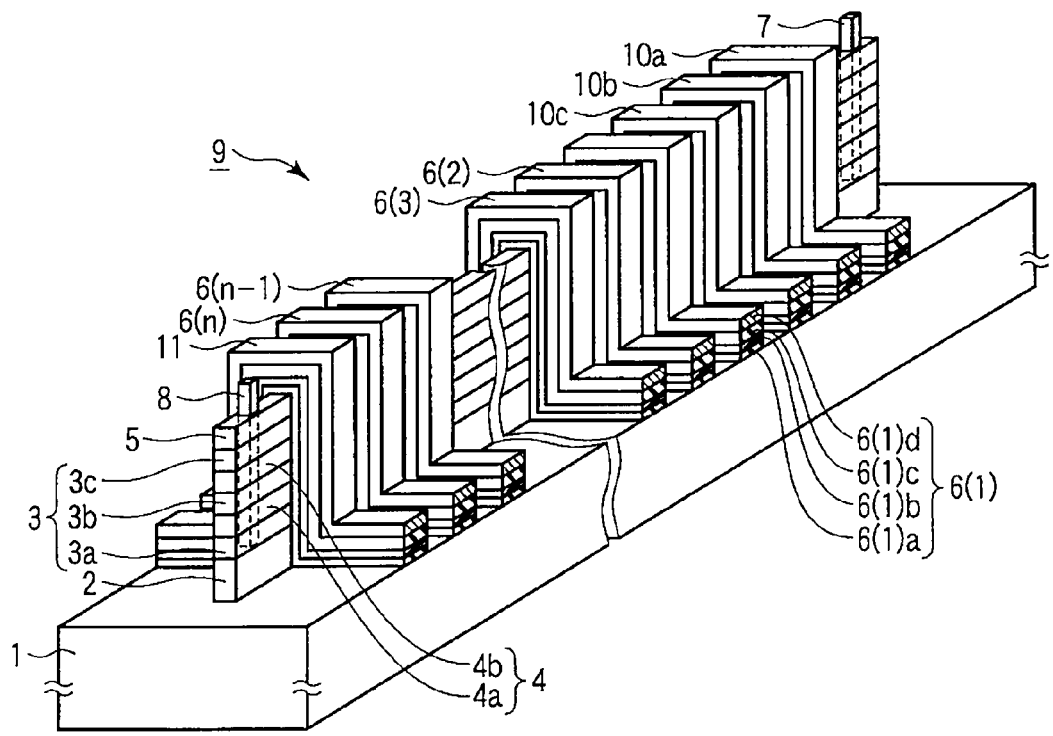
F I G. 4F

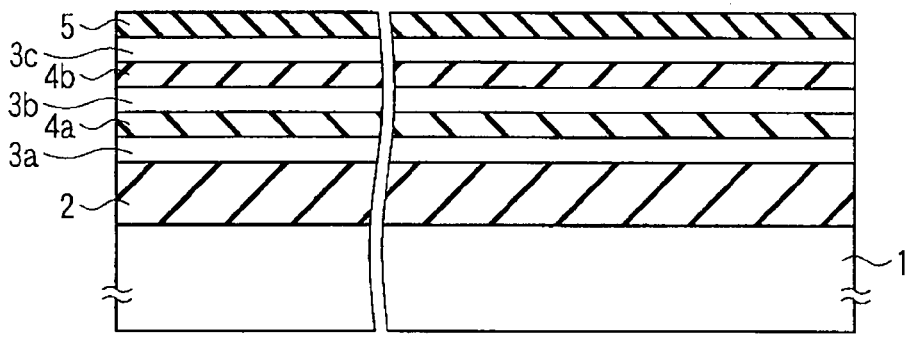
F I G. 5A
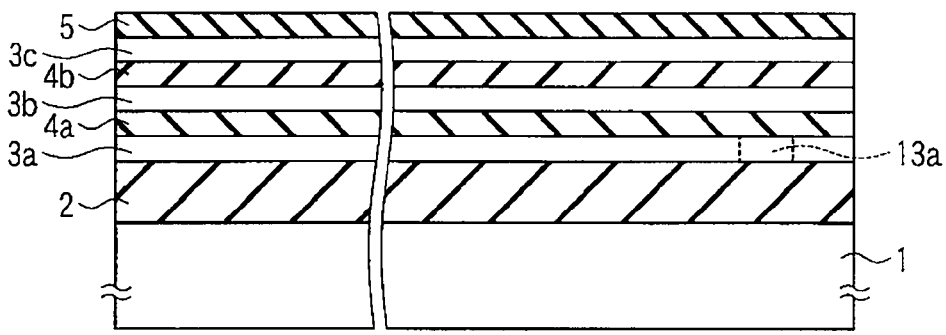
F I G. 5B
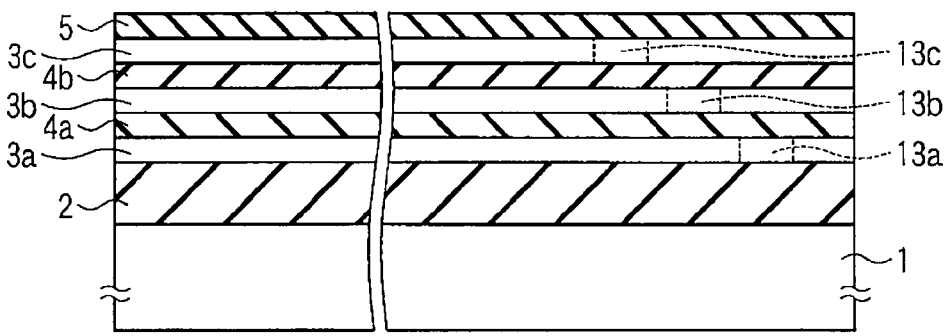
F I G. 5C

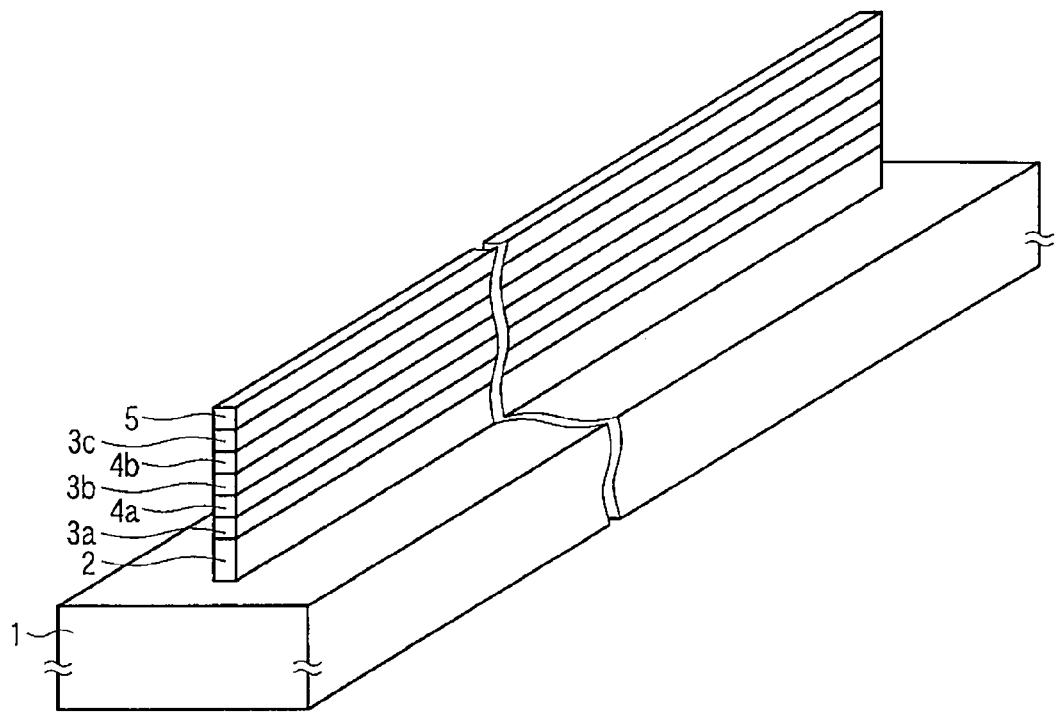
F I G. 6A
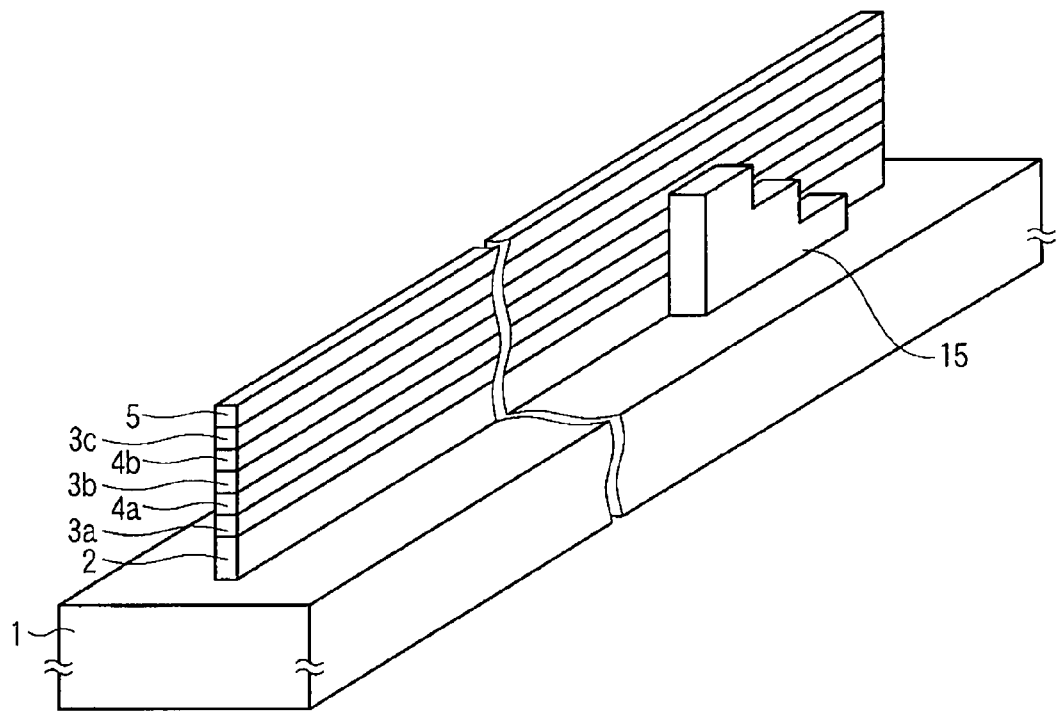
F I G. 6B

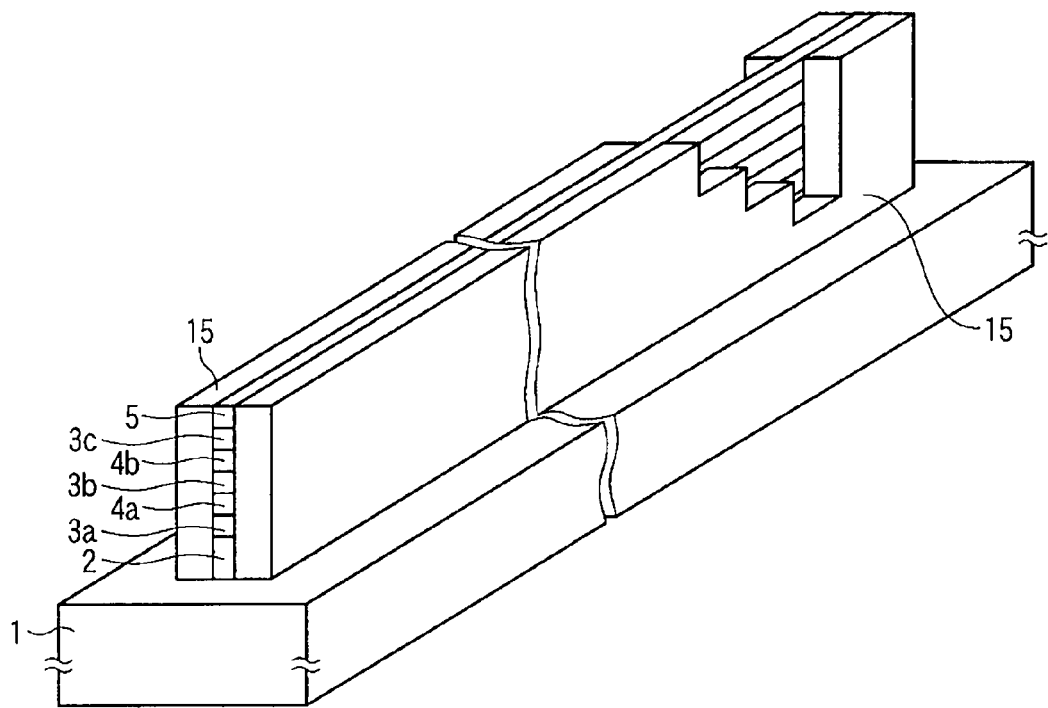
F I G. 7A
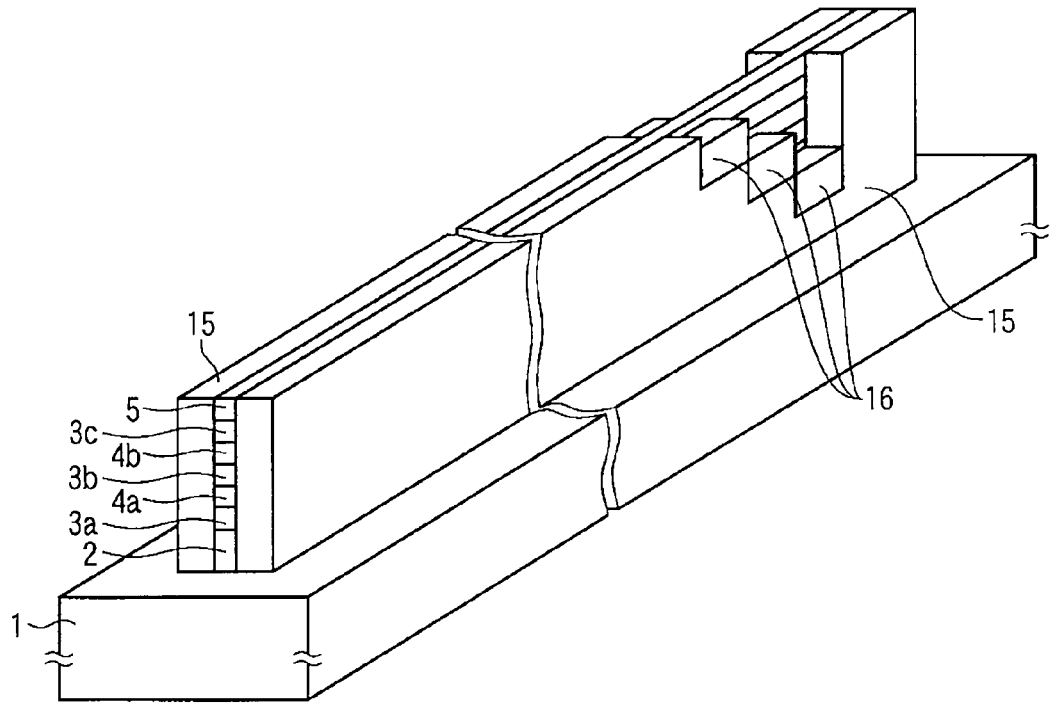
F I G. 7B

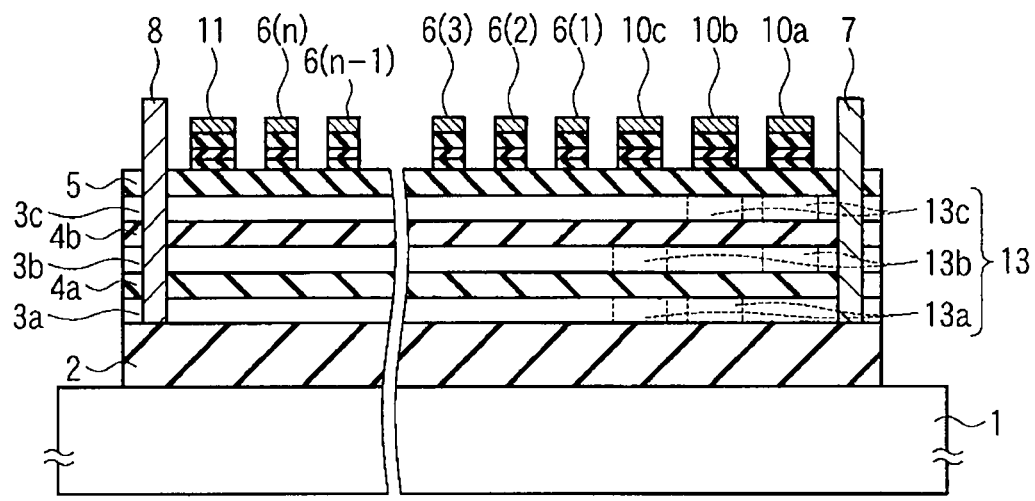
F I G. 8

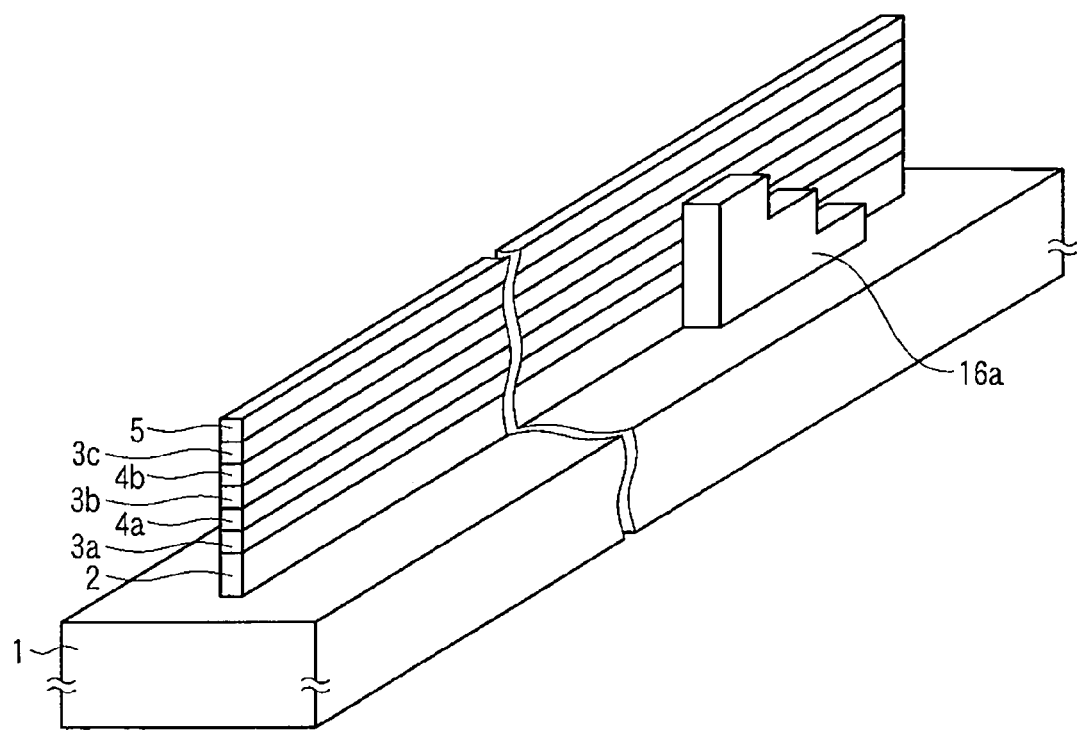
F I G. 9A
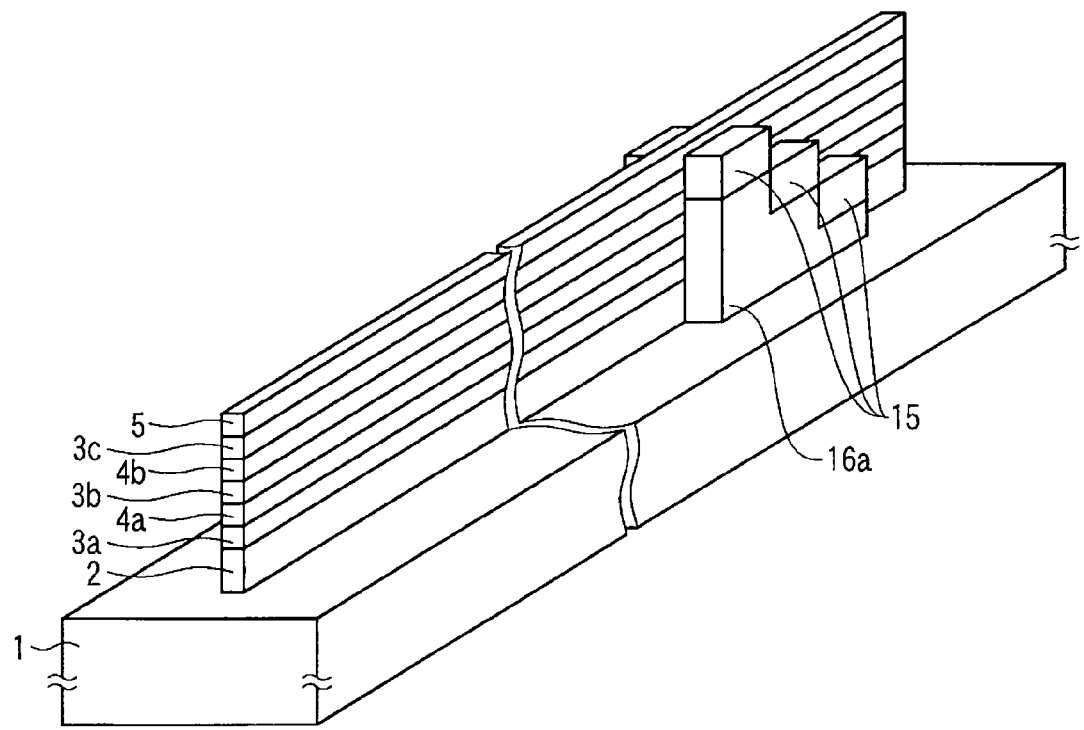
F I G. 9B

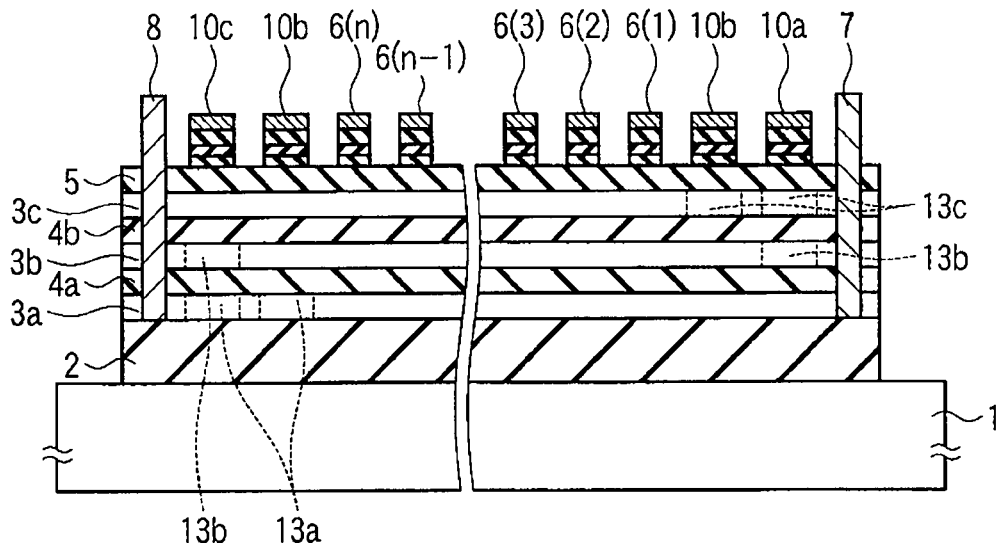
F I G. 11
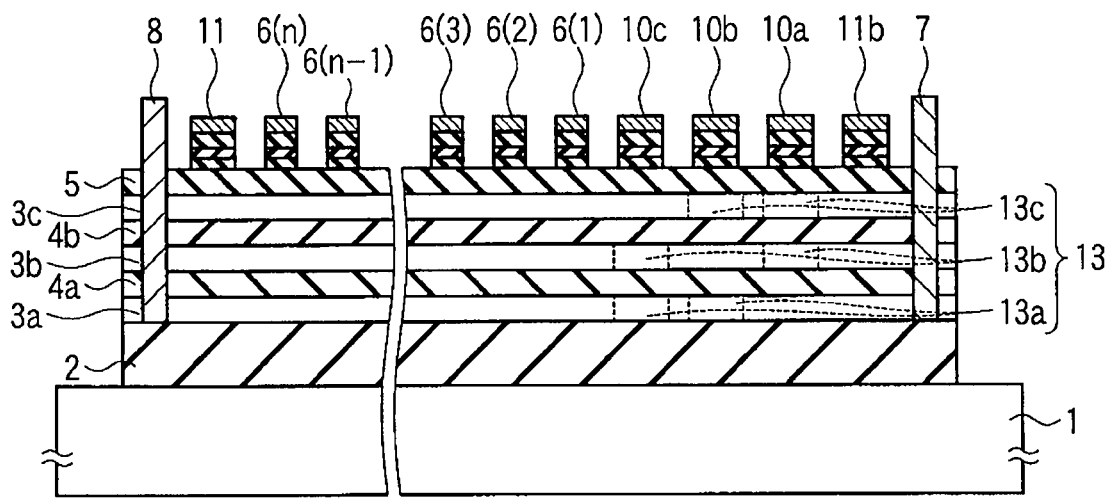
F I G. 12A

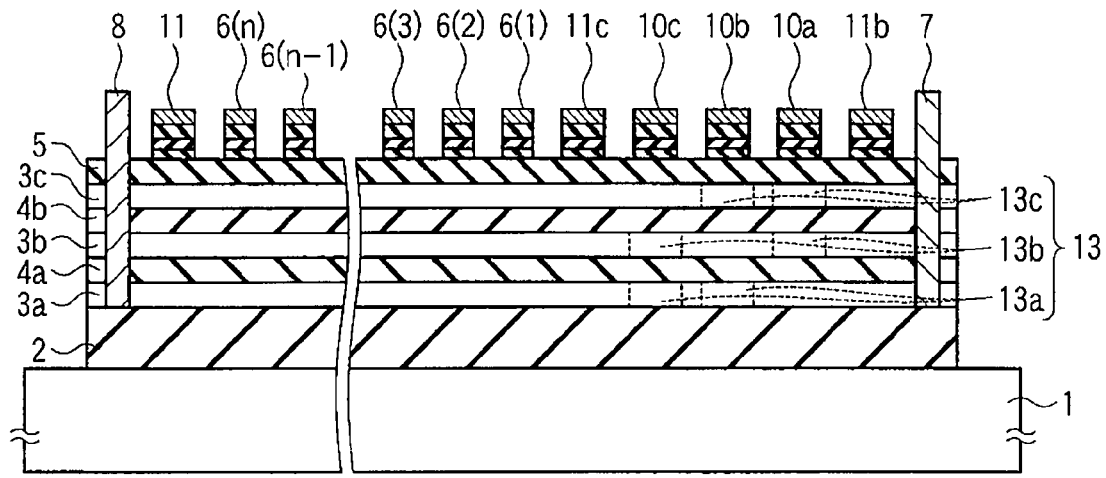
F I G. 12B
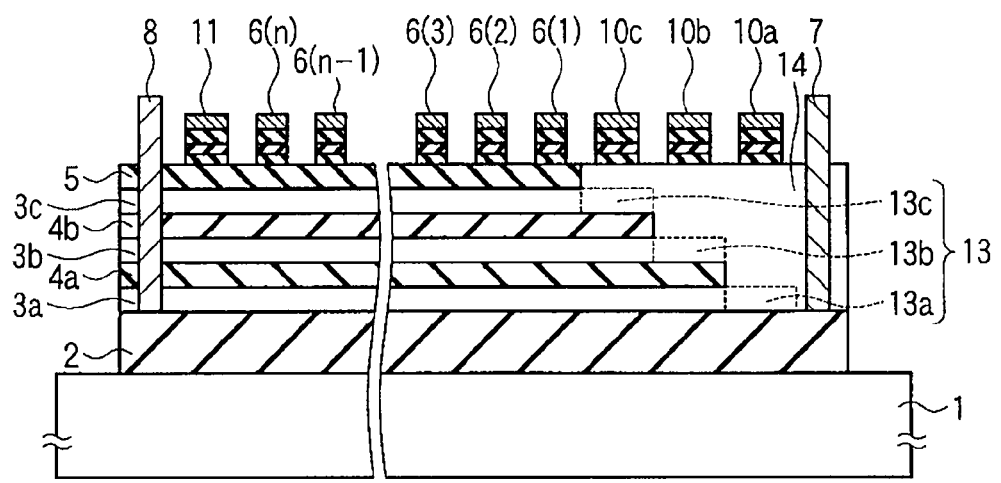
F I G. 13

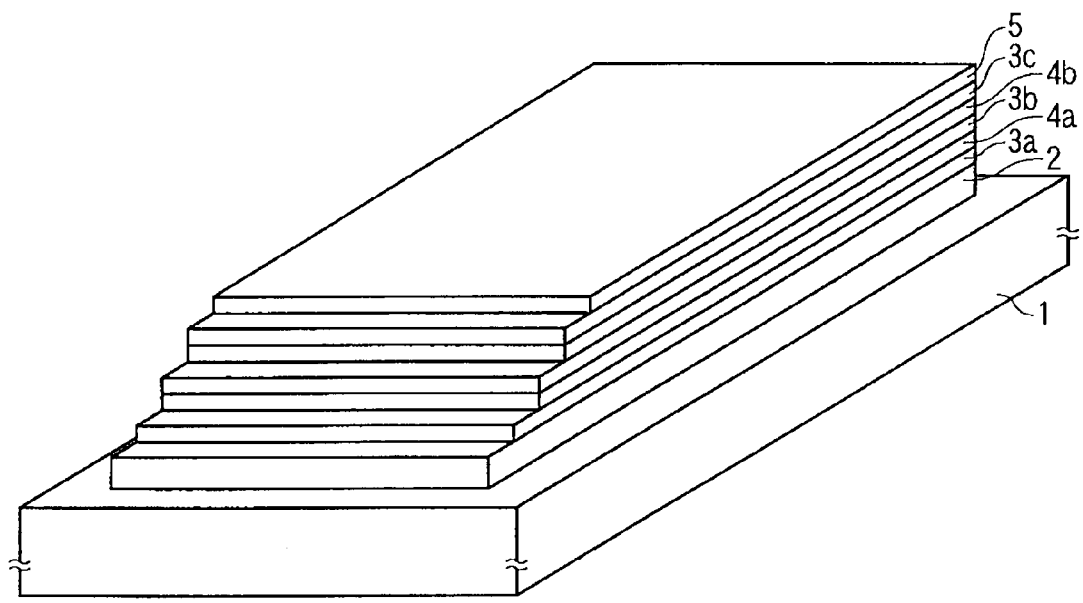
F I G. 14A
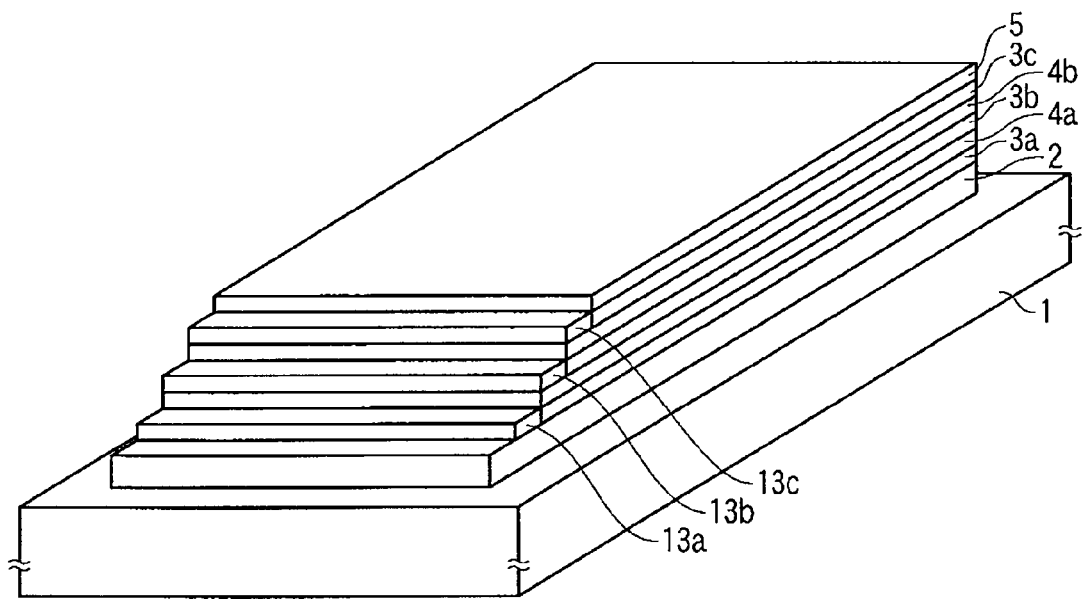
F I G. 14B

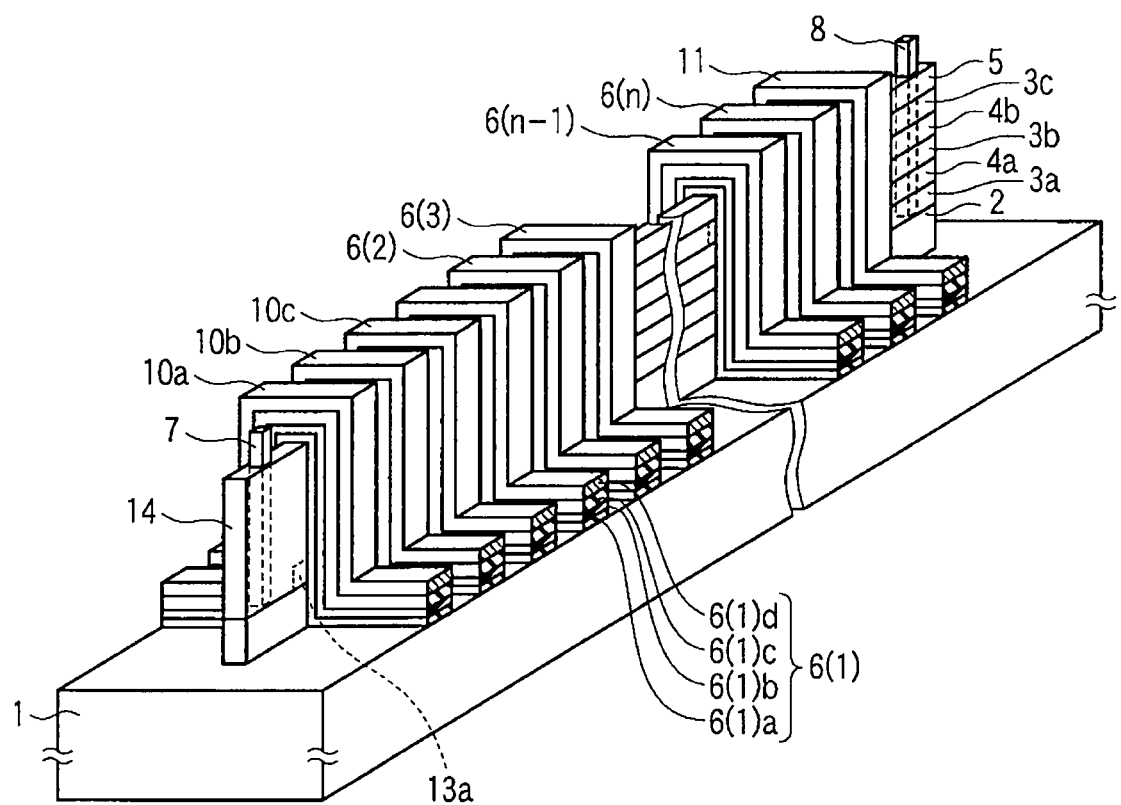
F I G. 14E

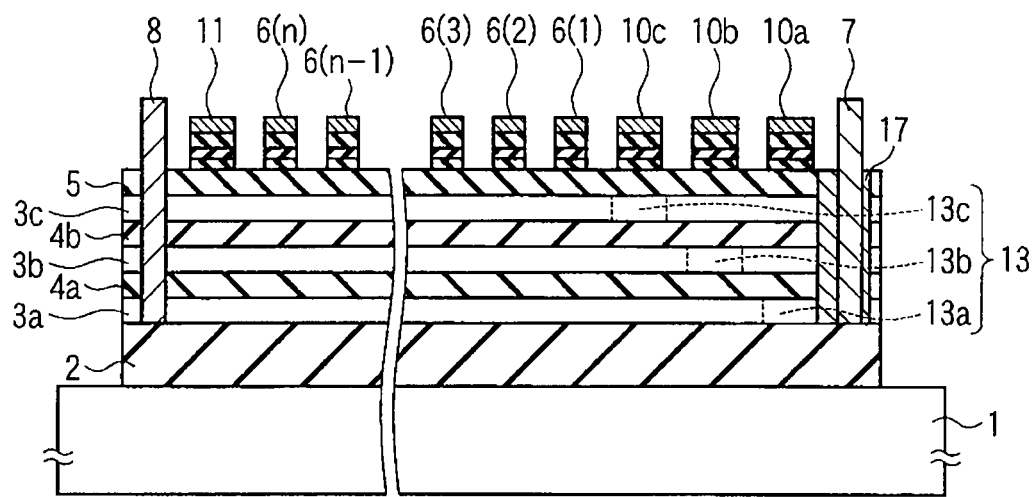
F I G. 15
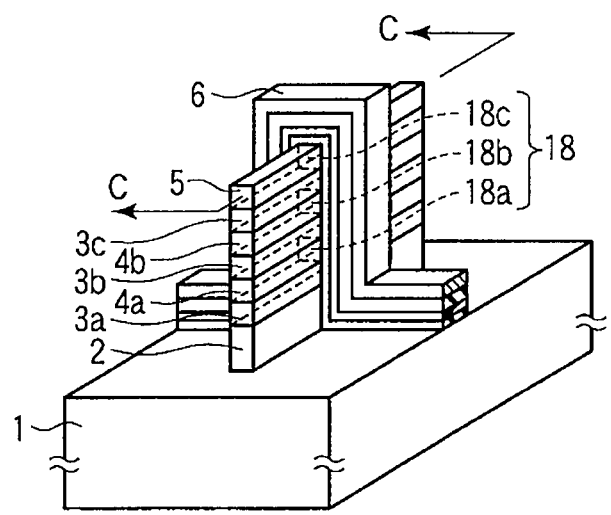
F I G. 16A

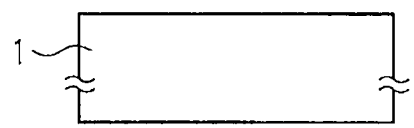
F I G. 18A
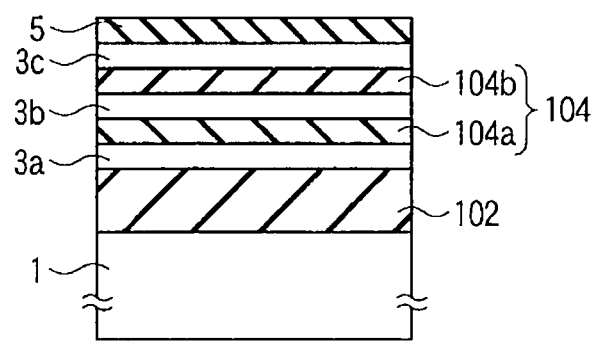
F I G. 18B
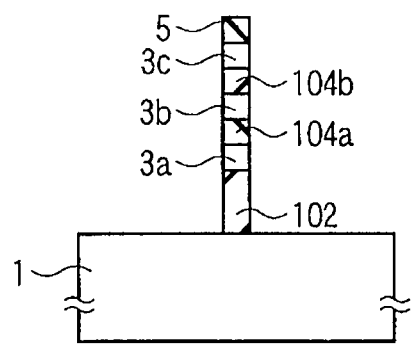
F I G. 18C

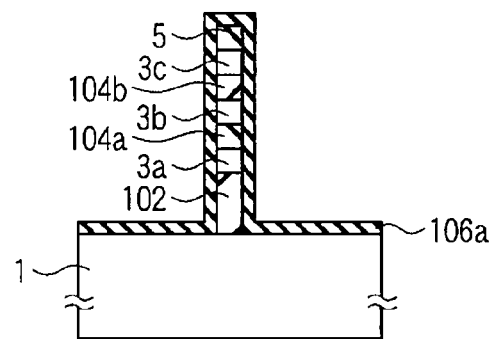
F I G. 18D
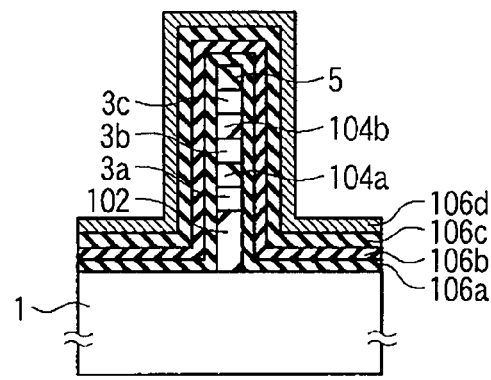
F I G. 18E
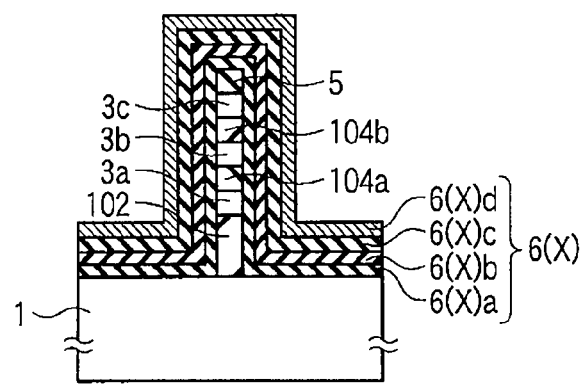
F I G. 18F

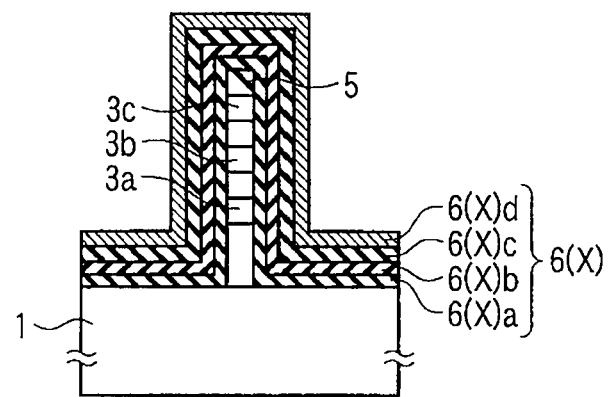
F I G. 18G
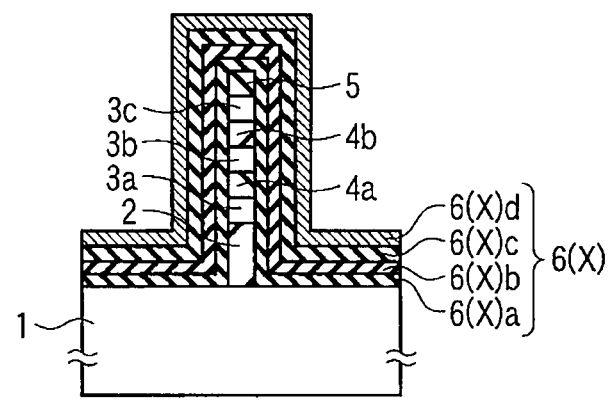
F I G. 18H

NONVOLATILE SEMICONDUCTOR MEMORY

CROSS REFERENCE TO RELATED APPLICATIONS

This application is a Continuation Application of PCT Application No. PCT/JP2009/060803, filed Jun. 12, 2009, the entire contents of which are incorporated herein by reference.

FIELD

Embodiments described herein relate generally to a nonvolatile semiconductor memory.

BACKGROUND

To increase the degree of integration and the capacity of a NAND flash memory, the design rule needs to be smaller. To reduce the design rule, it is necessary to more finely pattern interconnection patterns and the like. Implementing finer patterning of interconnection patterns and the like requires a very sophisticated processing technique. As a result, reduction of the design rule is difficult.

There has recently been proposed a nonvolatile semiconductor memory in which memory cells are three-dimensionally arranged to achieve a higher degree of memory integration.

In this nonvolatile semiconductor memory, stacked active areas are formed by batch processing, and gate contacts are also formed at once. Stacked memory strings are selected at once by a layer select transistor. This structure enables to reduce the chip area and increase the degree of memory integration. Since the stacked structure can be formed by batch processing, the manufacturing cost can largely be suppressed.

Even in this structure, however, a layer select transistor and a contact plug are formed for each layer of memory strings. For this reason, the area to form them is necessary. The number of memory strings consequently increases as the number of stacked layers increases. In addition, it is difficult to form an interconnection leader from each of the stacked memory strings. Furthermore, forming interconnection leaders leads to an increase in the number of interconnections and the circuit area, resulting in few merits in forming the stacked structure.

There is no disclosure of a nonvolatile semiconductor memory structure capable of solving these problems at the moment.

BRIEF DESCRIPTION OF THE DRAWINGS

FIG. 1 is a perspective view showing a structure according to an embodiment;

FIG. 2 is a sectional view taken along a line A-A in FIG. 1;

FIG. 3 is a perspective view showing the structure according to the embodiment;

FIGS. 4A, 4B, 4C, 4D, 4E and 4F are perspective views showing a manufacturing method according to the embodiment;

FIGS. 5A, 5B and 5C are sectional views showing the manufacturing method according to the embodiment;

FIGS. 6A, 6B and 6C, 7A and 7B are perspective views showing the manufacturing method according to the embodiment;

FIG. 8 is a sectional view taken along the line A-A in FIG. 1;

FIGS. 9A, 9B, 9C and 9D are perspective views showing the manufacturing method according to the embodiment;

FIG. 11 is a sectional view showing another structure according to the embodiment;

FIGS. 12A and 12B are sectional views showing the structure according to the embodiment;

FIG. 13 is a sectional view showing the structure according to the embodiment;

FIGS. 14A, 14B, 14C, 14D and 14E are perspective views showing the manufacturing method according to the embodiment;

FIG. 15 is a sectional view showing the structure according to the embodiment;

FIG. 16A is a perspective view showing the structure according to the embodiment;

FIGS. 18A, 18B, 18C, 18D, 18E, 18F, 18G and 18H are sectional views showing the manufacturing method according to the embodiment.

DETAILED DESCRIPTION

Figure 6C:
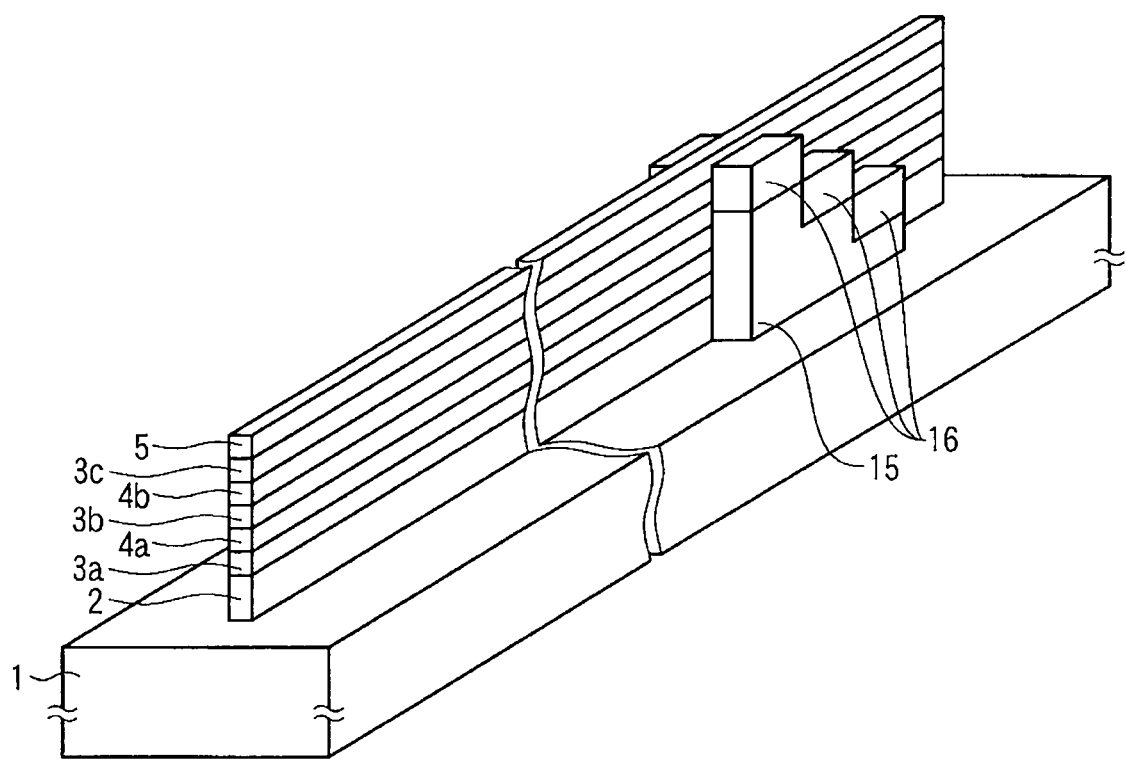

In general, according to one embodiment, a nonvolatile semiconductor memory comprising: a semiconductor substrate; first to n-th (n is a natural number not less than 2) semiconductor layers which are stacked in order from the semiconductor substrate side in a first direction perpendicular to a surface of the semiconductor substrate and extend in a second direction parallel to the surface of the semiconductor substrate, and the semiconductor layers isolated each other and having a stair case pattern in a first end of the second direction; a common semiconductor layer connected to the first to n-th semiconductor layers commonly in the first end of the second direction; a first electrode connected to the common semiconductor layer; a second electrode connected to the first to n-th semiconductor layers in a second end of the second direction; first to n-th memory strings which uses the first to n-th semiconductor layers as channels of the first to n-th memory strings; first to n-th layer select transistors which are provided in order from the first electrode side between the first electrode and the first to n-th memory strings, and select one of the first to n-th memory strings; and first to n-th impurity regions which are provided in the first end of the second direction of the first to n-th semiconductor layers respectively to make the i-th layer select transistor (i is one of 1 to n) a normally-on state in the first end of the second direction of the i-th semiconductor layer and to make the remaining layer select transistor an on/off-controllable state in the first end of the second direction of the remaining semiconductor layer.

The embodiments will now be described with reference to the accompanying drawings. Note that the same reference numerals denote the common parts throughout the embodiments, and a repetitive description thereof will be omitted. The drawings are schematic views for explaining the present embodiment and helping understanding thereof. Although the shapes, dimensions, and ratios may be different from those of an actual device, the design can be changed as needed in consideration of the following description and known technologies.

FIG. 1 is a schematic perspective view of nonvolatile semiconductor memory 9 according to an embodiment.

Silicon layers 3 and insulating layers 4 are alternately stacked in the order of 3a, 4a, 3b, 4b and 3c on insulating film 2 on the major surface of silicon substrate (semiconductor substrate) 1. Insulating film 5 is stacked on silicon layer 3c.

Note that although silicon layer 3 includes three layers 3a, 3b and 3c in this embodiment, the present embodiment is not limited to this. The number of layers is preferably larger because the more the layers are, the larger the capacity of the memory is.

The number of insulating layers 4 also increases or decreases in accordance with the number of silicon layers 3.

Insulating film 2 is formed from, for example, a silicon oxide film ($SiO_2$). Silicon layer 3 can have either an amorphous state or a polysilicon state, and preferably has a single-crystal state.

Insulating layer 4 is formed from, for example, a silicon oxide film ($SiO_2$). However, another insulating film is usable if it can electrically insulate each silicon (Si) layer 3.

Insulating film 5 is formed from, for example, a silicon oxide film. However, another insulating film such as a silicon nitride film ($SiN_x$) or a stacked structure thereof is also usable.

Stacked films 6(X) are formed to surround the stacked structure of insulating film 2, silicon layers 3, insulating layers 4, and insulating film 5. X is a natural number of 1 to n, and n stacked films 6 are formed while being electrically insulated.

Each stacked film 6 includes insulating film 6(X)a, charge storage layer 6(X)b, insulating film 6(X)c, and electrode 6(X)d. Electrically insulating stacked films 6 means electrically insulating at least electrodes 6(X).

Hence, although FIG. 1 illustrates all stacked films 6 formed independently, some or all of insulating films 6(X)a, charge storage layers 6(X)b, and insulating films 6(X)c may be connected.

Insulating film 6(X)a is formed from, for example, a silicon oxide film ($SiO_2$). Charge storage layer 6(X)b is formed from, for example, a silicon nitride film ($Si_3N_4$). Insulating film 6(X)c is formed from, for example, a silicon oxide film ($SiO_2$). Electrode 6(X)d is formed from, for example, nickel silicide (NiSi).

The stacked structure including insulating film 6(X)a, charge storage layer 6(X)b, insulating film 6(X)c, and electrode 6(X)d stacked on silicon layer 3 forms a memory cell having a double gate structure (a structure including control gates arranged on both sides of silicon layer 3) using silicon layer 3 as a channel, insulating film 6(X)a as a tunnel film, charge storage layer 6(X)b as a charge storage layer, insulating film 6(X)c as a block insulating film, and electrode 6(X)d as a control gate.

Stacked films 6(X) are electrically insulated and form one memory string structure altogether. In FIG. 1, silicon layers 3 are stacked each of which is controllable as the channel of an independent memory string. Hence, in the structure shown in FIG. 1, the memory strings are three-dimensionally stacked.

Note that insulating film 6(X)a can selectively use a material necessary for a nonvolatile semiconductor memory of each generation as needed.

More specifically, a silicon oxynitride film, a combination of a silicon oxide film and a silicon nitride film, and the like are applicable. Materials prepared by mixing silicon nanoparticles or metal ions into these films are also effective. The materials may be combined.

Charge storage layer 6(X)b can selectively use a material necessary for a nonvolatile semiconductor memory of each generation as needed.

More specifically, a hafnium oxide film ($HfO_2$), a material obtained by changing the composition ratio of silicon and nitrogen that are the elements contained in a silicon nitride film (SiN) or the like, and a material prepared by mixing silicon nanoparticles or metal ions into these films are also effective. The materials may be combined. Alternatively, a semiconductor layer such as a silicon layer may be used.

Insulating film 6(X)c can selectively use a material necessary for a nonvolatile semiconductor memory of each generation as needed.

More specifically, a silicon oxide film, an aluminum oxide film ($Al_2O_3$), a lanthanum aluminum oxide film ($LaAlO_3$), a lanthanum aluminum silicon oxide film (LaAlSiO), and a material obtained by changing the composition ratio of the elements may be used.

Electrode 6(X)d can selectively use a material necessary for a nonvolatile semiconductor memory of each generation as needed.

More specifically, the same effect can be obtained by metal compounds such as tantalum nitride (TaN), tantalum carbide (TaC), and titanium nitride (TiN).

V, Cr, Mn, Y, Mo, Ru, Rh, Hf, Ta, W, Ir, Co, Ti, Er, Pt, Pd, Zr, Gd, Dy, Ho and Er which exhibit the electrical conductivity of a metal, and various silicides thereof can also be used.

In this embodiment, layer select transistors 10 including layer select transistors 10a, 10b and 10c and select transistor 11 are formed in parallel to stacked films 6(X).

FIG. 1 illustrates layer select transistors 10 and select transistor 11 having the same structure as that of stacked film 6(X). However, any other structure that performs the transistor operation using silicon layer 3 as a channel is usable.

That is, layer select transistor 10 can be, for example, a MOS (Metal-Oxide-Semiconductor) transistor that has a structure including one insulating film and one gate electrode, unlike the memory cell.

As shown in FIG. 2 that illustrates a section taken along a line A-A of FIG. 1, each silicon layer 3 has an impurity-doped region, where layer select transistor 10 is normally on, in partial region 13 of the channel portion of layer select transistor 10.

For example, as shown in FIG. 2, silicon layer 3a has an impurity-doped region formed in channel region 13a of layer select transistor 10a. Silicon layer 3b has an impurity-doped region formed in channel region 13b of layer select transistor 10b. Silicon layer 3c has an impurity-doped region formed in channel region 13c of layer select transistor 10c.

Note that examples of the impurity material are impurities such as pentads including arsenic (As) and phosphorus (P) which form an n-type semiconductor, and impurities such as triads including boron (B) and indium (In) which form a p-type semiconductor. These materials may be combined.

Each silicon layer 3 (memory string) is controlled by on/off-controllable layer select transistors 10, for example, layer select transistors 10 containing no impurity in the channels. However, the channel of on/off-controllable layer select transistor 10 may be doped with an impurity for threshold control.

In this case, the memory string of silicon layer 3a is controlled by layer select transistors 10b and 10c. The memory string of silicon layer 3b is controlled by layer select transistors 10a and 10c. The memory string of silicon layer 3c is controlled by layer select transistors 10a and 10b.

Electrodes are conventionally formed independently for the layers of the memory strings to ensure the contacts. In the above structure, however, electrodes 7 and 8 are only formed to commonly ensure contacts to all silicon layers 3 represented by, for example, FIG. 1.

Even when the memory strings are stacked, the memory string length increases only in the region where layer select transistors 10 are formed in each layer. Hence, the memory strings can be shortened as compared to the conventional structure in which a contact electrode and a select transistor are formed each time a memory string is stacked.

Note that not only tungsten (W) but also a metal material such as aluminum (Al) are usable for electrodes 7 and 8.

To increase the degree of integration, it is effective to parallelly array the memory strings, as shown in FIG. 3. In this case, if the number of contact electrodes increases every time a layer of memory strings is added, as in the conventional memory, the number of interconnections led from the them and the area of circuits for control increase.

On the other hand, in this embodiment, the number of contact electrodes does not increase even if a layer of memory strings is added. It is therefore possible to suppress the increase amount only for one additional layer select transistor 10 corresponding to one additional layer and thus reduce the chip area.

Note that although FIG. 3 illustrates a structure in which three memory strings are arranged, the present embodiment is not limited to this.

The structure need not always have the form shown in FIG. 2 and can be modified as needed if it can control the memory strings.

For example, impurity-doped regions 13 may exist in each silicon layer 3, as shown in FIG. 8. Alternatively, layer select transistors may be formed on both sides to sandwich stacked films 6(X), as shown in FIG. 11. As shown in FIG. 11, the number of layer select transistors 10 need not always the same as that of silicon layers 3, and can be larger or smaller if the structure can control the memory strings.

Arranging the layer select transistors to sandwich the memory strings, as shown in FIG. 11, allows to minimize the influence of diffusion of impurity-doped regions 13.

However, from the viewpoint of the memory string length, the number of layer select transistors is preferably smaller for shortening the memory strings and thus increasing the degree of integration.

FIGS. 4A, 4B, 4C, 4D, 4E and 4F illustrate steps in the manufacture of nonvolatile semiconductor memory 9 according to the embodiment and, more particularly, a step of forming impurity-doped regions 13 in silicon layers 3.

First, as shown in FIG. 4A, for example, p-type (first conductivity type) silicon substrate 1 having a plane orientation (100) and a resistivity of 10 to 20 Ω·cm is prepared. Silicon layer 3a is stacked on silicon oxide film layer 2 on silicon substrate 1 by, for example, deposition.

Although not illustrated, patterning is performed to form an opening in an applied resist using a photo etching process (to be referred to as "PEP" hereinafter; lithography using a so-called photoresist). Ion implantation is performed to form impurity-doped region 13a in silicon layer 3a.

In accordance with the same procedure as described above, silicon layer 3b is stacked on silicon oxide film layer 4a, and patterning using PEP and ion implantation are performed to form impurity-doped region 13b.

In accordance with the same procedure as described above, silicon layer 3c is stacked on silicon oxide film layer 4b, and patterning using PEP and ion implantation are performed to form impurity-doped region 13c.

Silicon oxide film layer 5 is stacked on silicon layer 3c. FIG. 4B illustrates this state.

For example, after patterning by PEP, anisotropic dry etching is performed to process silicon oxide film layer 2, silicon layer 3a, silicon oxide film layer 4a, silicon layer 3b, silicon oxide film layer 4b, silicon layer 3c, and insulating film 5 on silicon substrate 1 into a strip (fin) shape as shown in FIG. 4C.

Silicon oxide film layer 2, silicon layer 3a, silicon oxide film layer 4a, silicon layer 3b, silicon oxide film layer 4b, silicon layer 3c, and insulating film 5, which are processed into a fin shape, on silicon substrate 1 undergo, for example, thermal oxidation to form silicon oxide film 106a.

Silicon oxide film 106a can also be formed by deposition. Not the silicon oxide film but a tunnel insulating film material necessary for a nonvolatile semiconductor memory of each generation may selectively be used as needed.

Next, charge storage layer 106b, insulating film 106c, and electrode 106d are deposited. FIG. 4D illustrates this state.

As shown in FIG. 4E, for example, after patterning by PEP, anisotropic dry etching is performed for silicon oxide film 106a, charge storage layer 106b, insulating film 106c, and electrode 106d to form stacked films 6(X), layer select transistors 10, and select transistor 11 shown in FIG. 1 which are electrically insulated.

At this time, layer select transistors 10 need to be formed at positions where corresponding impurity-doped regions 13 serve as channels.

Although not illustrated, for example, a silicon oxide film is buried in the entire structure, and CMP (Chemical Mechanical Polishing) is performed, thereby forming an interlayer dielectric film buried between stacked films 6(X), layer select transistors 10, select transistor 11, and silicon oxide film layer 2, silicon layer 3a, silicon oxide film layer 4a, silicon layer 3b, silicon oxide film layer 4b, silicon layer 3c, and insulating film 5, which are processed into a fin shape, on silicon substrate 1.

As shown in FIG. 4F, for example, after patterning by PEP, anisotropic dry etching is performed to form hole patterns in regions where electrodes 7 and 8 should be formed. After that, for example, tungsten is deposited. CMP is then performed for the tungsten outside the hole patterns to form electrodes 7 and 8. Nonvolatile semiconductor memory 9 in FIG. 1 is thus formed.

The manufacturing step for forming the embodiment shown in FIGS. 1 and 2 has been described above. Although not particularly illustrated, other embodiments can also be formed by partially changing the manufacturing step.

To form the structure shown in FIG. 8, patterning by PEP is changed to form impurity-doped regions 13 shown in FIG. 8 in the step of forming impurity-doped regions 13 shown in FIGS. 4A and 4B.

To form the structure shown in FIG. 11, patterning by PEP is changed to form impurity-doped regions 13 shown in FIG. 11 in the step of forming impurity-doped regions 13 shown in FIGS. 4A and 4B. Then, patterning by PEP is changed to increase the length of the fin in accordance with the increase in the number of layer select transistors in processing the fin shown in FIG. 4C. After that, patterning by PEP is changed to form the structure shown in FIG. 11 even in processing shown in FIG. 4E.

As described above, to form the impurity-doped regions, PEP is necessary. However, the PEP can be rougher than that for contact formation. This enables to suppress the production cost and obviate the necessity for forming a complex shape and thus facilitate formation. Electrodes 7 and 8 can be formed simultaneously because they can have the same process depth. The structure is more advantageous than the conventional one in the above-described points.

FIGS. 5A, 5B and 5C illustrate steps in the manufacture of nonvolatile semiconductor memory 9 according to the embodiment and, more particularly, a step of forming impurity-doped regions 13 in silicon layers 3.

First, for example, p-type (first conductivity type) silicon substrate 1 having a plane orientation (100) and a resistivity of 10 to 20 Ωcm is prepared. Silicon layers and silicon oxide film layers are alternately stacked on silicon oxide film layer 2 on silicon substrate 1 by, for example, deposition in the order of silicon layer 3a, silicon oxide film layer 4a, silicon layer 3b, silicon oxide film layer 4b, and silicon layer 3c. Insulating film 5 is formed on uppermost silicon layer 3 by, for example, deposition. FIG. 5A illustrates this state.

Resist patterning by PEP is then performed, and ion implantation is executed to form impurity-doped region 13a in silicon layer 3a. FIG. 5B shows this state.

In a similar manner, patterning by PEP and ion implantation are performed to form impurity-doped region 13b in silicon layer 3b and impurity-doped region 13c in silicon layer 3c. At this time, impurity-doped regions 13a, 13b and 13c are formed while changing the depth by changing the energy of ions to be implanted. FIG. 5C shows this state.

This state corresponds to FIG. 4B described above. Although the subsequent steps are not illustrated, the same procedure as that of the process described above with reference to FIGS. 4C, 4D, 4E and 4F is performed to form nonvolatile semiconductor memory 9 in FIG. 1.

The manufacturing step for forming the embodiment shown in FIGS. 1 and 2 has been described above. Although not particularly illustrated, other embodiments can also be formed by partially changing the manufacturing step.

To form the structure shown in FIG. 8, patterning by PEP is changed to form impurity-doped regions 13 shown in FIG. 8 in the step of forming impurity-doped regions 13 shown in FIGS. 5B and 5C.

To form the structure shown in FIG. 11, patterning by PEP is changed to form impurity-doped regions 13 shown in FIG. 11 in the step of forming impurity-doped regions 13 shown in FIGS. 5B and 5C. Then, patterning by PEP is changed to increase the length of the fin in accordance with the increase in the number of layer select transistors in processing the fin shown in FIG. 4C. After that, patterning by PEP is changed to form the structure shown in FIG. 11 even in processing shown in FIG. 4E.

The above-described formation method allows to continuously form silicon layers 3. In addition, since the resist does not contact silicon layers 3, silicon layers 3 are not contaminated, and degradation in the characteristic of the channels can be suppressed.

However, as compared to the process shown in FIGS. 4A, 4B, 4C, 4D, 4E and 4F, it is difficult to form the impurity-doped regions at high controllability. For example, when impurity-doped region 13a is formed in silicon layer 3a in FIG. 5B, the impurity may be doped into the regions of silicon layers 3b and 3c above impurity-doped region 13a.

FIGS. 6A, 6B and 6C illustrate steps in the manufacture of nonvolatile semiconductor memory 9 according to the embodiment and, more particularly, a step of forming impurity-doped regions 13 in silicon layers 3.

First, as shown in FIG. 6A, for example, p-type (first conductivity type) silicon substrate 1 having a plane orientation (100) and a resistivity of 10 to 20 Ω·cm is prepared. Silicon layers and silicon oxide film layers are alternately stacked on silicon oxide film layer 2 on silicon substrate 1 by, for example, deposition in the order of silicon layer 3a, silicon oxide film layer 4a, silicon layer 3b, silicon oxide film layer 4b, and silicon layer 3c. Insulating film 5 is formed on uppermost silicon layer 3c by, for example, deposition.

For example, after patterning by PEP, anisotropic dry etching is performed to process silicon oxide film layer 2, silicon layer 3a, silicon oxide film layer 4a, silicon layer 3b, silicon oxide film layer 4b, silicon layer 3c, and insulating film 5 on silicon substrate 1 into a fin shape as shown in FIG. 6A.

A silicon oxide film is deposited. For example, after patterning by PEP, anisotropic dry etching is performed to process the silicon oxide film into a staircase shape in contact with the fin-shaped stacked film (silicon oxide film layer 2, silicon layer 3a, silicon oxide film layer 4a, silicon layer 3b, silicon oxide film layer 4b, silicon layer 3c, and insulating film 5 on silicon substrate 1), as indicated by 15 in FIG. 6B.

At this time, the upper surfaces of the stairs are preferably located under the upper surfaces of silicon layers 3a, 3b and 3c, respectively.

A silicon oxide film doped with an impurity desirable for making impurity-doped regions 13 is deposited. For example, after patterning by PEP, anisotropic dry etching is performed to process the silicon oxide film into such shapes that respectively remain on the stairs of silicon oxide film 15, as indicated by 16 in FIG. 6C.

At this time, the upper surfaces of silicon oxide films 16 are preferably located under the upper surfaces of silicon oxide films 4a and 4b and insulating film 5 formed on silicon layers 3 in contact with silicon oxide films 16, respectively.

The structure is heated to, for example, 1000° C. to allow solid-phase diffusion of the impurity from impurity-doped silicon oxide films 16 to silicon layers 3 that are in contact with impurity-doped silicon oxide films 16, thereby forming impurity-doped regions 13.

Silicon oxide film 15 and impurity-doped silicon oxide films 16 are removed by, for example, anisotropic dry etching to obtain the same structure as shown in FIG. 4C.

Although the subsequent steps are not illustrated, the same procedure as that of the process described above with reference to FIGS. 4C, 4D, 4E and 4F is performed to form nonvolatile semiconductor memory 9 in FIGS. 1 and 2.

Figure 9C:
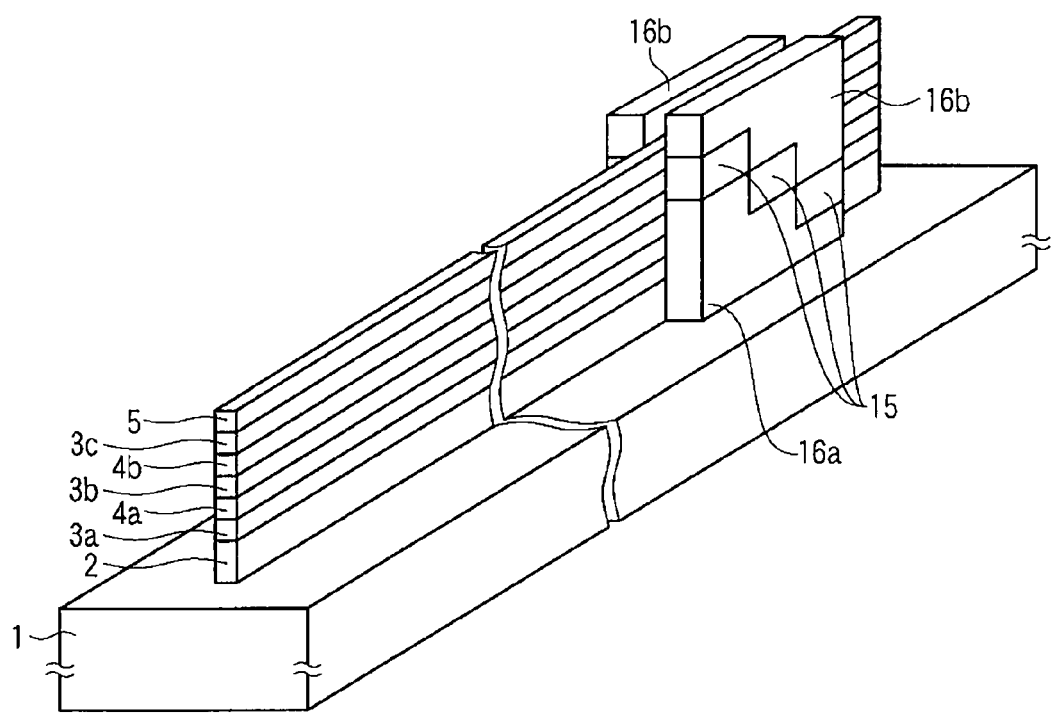

To form the structure shown in FIG. 8, silicon oxide film 15 and impurity-doped silicon oxide film 16 are replaced, as shown in FIG. 9.

First, silicon oxide film layer 2, silicon layer 3a, silicon oxide film layer 4a, silicon layer 3b, silicon oxide film layer 4b, silicon layer 3c, and insulating film 5 are stacked on silicon substrate 1. For example, after patterning by PEP, anisotropic dry etching is performed to process the structure into a fin shape.

An impurity-doped silicon oxide film is deposited. For example, after patterning by PEP, anisotropic dry etching is performed to process the silicon oxide film into a staircase shape in contact with the fin-shaped stacked film (silicon oxide film layer 2, silicon layer 3a, silicon oxide film layer 4a, silicon layer 3b, silicon oxide film layer 4b, silicon layer 3c, and insulating film 5 on silicon substrate 1), as indicated by 16a in FIG. 9A.

At this time, the upper surfaces of the stairs are preferably located under the upper surfaces of silicon layers 3a, 3b and 3c, respectively.

A silicon oxide film is deposited. For example, after patterning by PEP, anisotropic dry etching is performed to process the silicon oxide film into such shapes that respectively remain on the stairs of impurity-doped silicon oxide film 16a, as indicated by 15 in FIG. 9B.

At this time, the upper surfaces of silicon oxide films 15 are preferably located under the upper surfaces of silicon oxide films 4a and 4b and insulating film 5 formed on silicon layers 3 in contact with silicon oxide films 15, respectively.

Next, an impurity-doped silicon oxide film is deposited. For example, after patterning by PEP, anisotropic dry etching is performed to process the impurity-doped silicon oxide film into such a shape that remains on the stairs of silicon oxide films 15, as indicated by 16b in FIG. 9C.

The structure is heated to, for example, 1000° C. to allow solid-phase diffusion of the impurity from impurity-doped silicon oxide films 16a and 16b to silicon layers 3 that are in contact with impurity-doped silicon oxide films 16a and 16b, thereby forming impurity-doped regions 13.

Figure 9D:
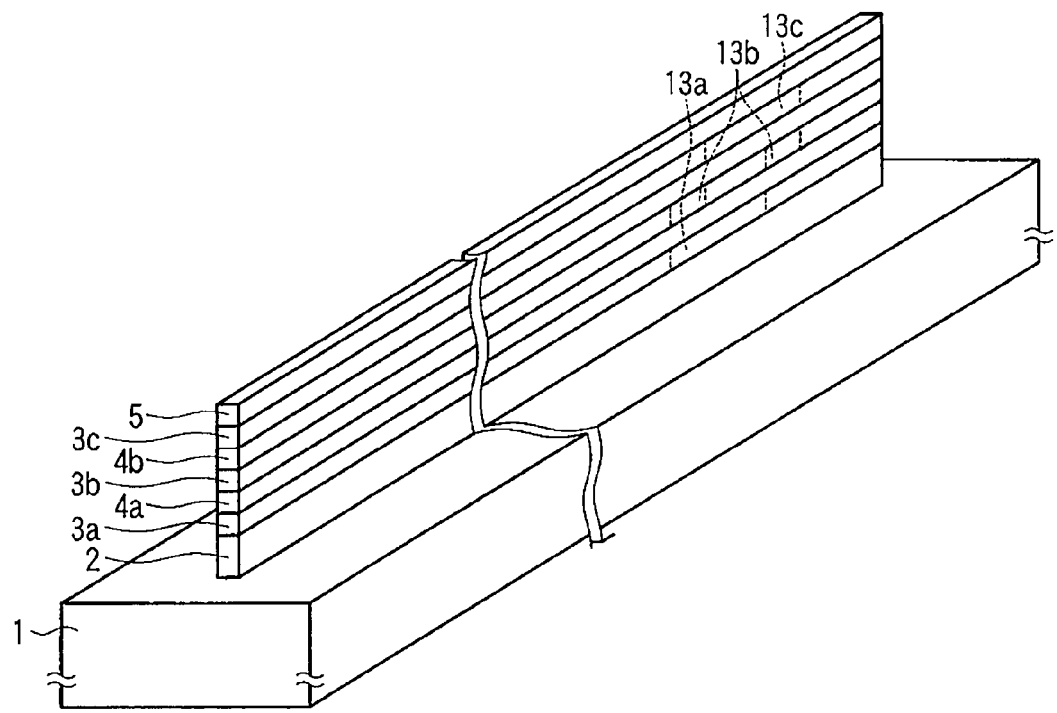

Silicon oxide films 15 and impurity-doped silicon oxide films 16a and 16b are removed by, for example, anisotropic dry etching to obtain the same structure as shown in FIG. 9D.

Although the subsequent steps are not illustrated, the same procedure as that of the process described above with reference to FIGS. 4D, 4E and 4F is performed to form nonvolatile semiconductor memory 9 shown in FIGS. 1 and 8.

Although not particularly illustrated, other embodiments can also be formed by partially changing the manufacturing step.

FIGS. 7A and 7B show steps in the manufacture of nonvolatile semiconductor memory 9 partially different from FIGS. 6A, 6B and 6C.

First, silicon oxide film layer 2, silicon layer 3a, silicon oxide film layer 4a, silicon layer 3b, silicon oxide film layer 4b, silicon layer 3c, and insulating film 5 are stacked on silicon substrate 1. For example, after patterning by PEP, anisotropic dry etching is performed to process the structure into a fin shape.

A silicon oxide film is deposited. For example, after patterning by PEP, anisotropic dry etching is performed to process the silicon oxide film into a staircase shape in contact with the fin-shaped stacked film (silicon oxide film layer 2, silicon layer 3a, silicon oxide film layer 4a, silicon layer 3b, silicon oxide film layer 4b, silicon layer 3c, and insulating film 5 on silicon substrate 1), as indicated by 15 in FIG. 7A.

At this time, the upper surfaces of the stairs are preferably located under the upper surfaces of silicon layers 3a, 3b and 3c, respectively.

Silicon insulating film layer 15 is formed into the shape as shown in FIG. 7A. This allows to form impurity-doped silicon oxide film layer 16 later as shown in FIG. 7B only by deposition and omit the process such as PEP. It is therefore possible to reduce the manufacturing cost.

After forming the structure shown in FIG. 7B, it is heated to, for example, 1000° C. to allow solid-phase diffusion of the impurity from impurity-doped silicon oxide films 16 to silicon layers 3 that are in contact with impurity-doped silicon oxide films 16, thereby forming impurity-doped regions 13.

Silicon oxide film 15 and impurity-doped silicon oxide films 16 are removed by, for example, anisotropic dry etching to obtain the same structure as shown in FIG. 4C.

Although the subsequent steps are not illustrated, the same procedure as that of the process described above with reference to FIGS. 4D, 4E and 4F is performed to form nonvolatile semiconductor memory 9 shown in FIGS. 1 and 2.

Figure 10A:
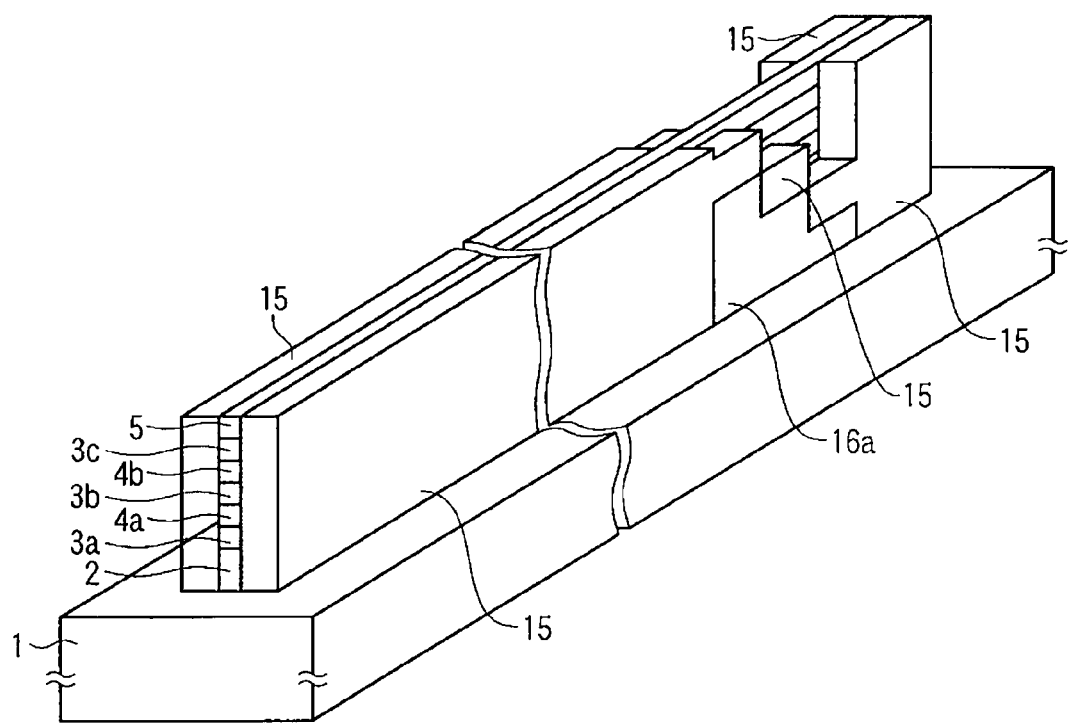
FIGS. 10A and 10B are perspective views showing the manufacturing method according to the embodiment.
Figure 10B:
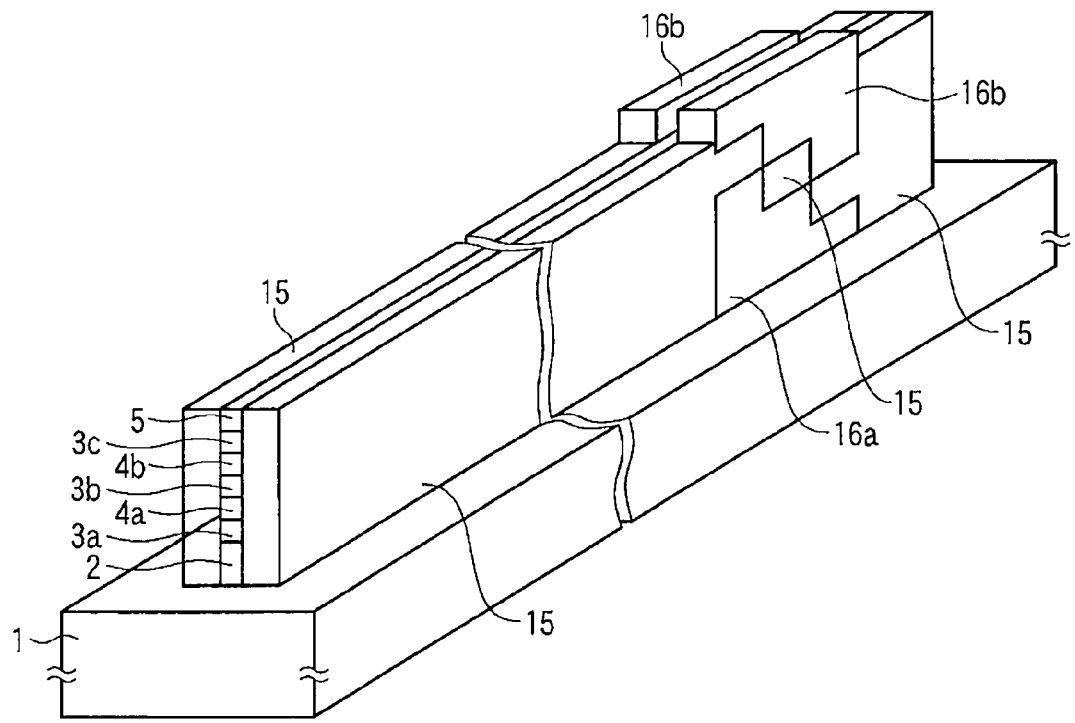

FIGS. 10A and 10B show steps in the manufacture of nonvolatile semiconductor memory 9 partially different from FIGS. 9A, 9B, 9C and 9D.

First, silicon oxide film layer 2, silicon layer 3a, silicon oxide film layer 4a, silicon layer 3b, silicon oxide film layer 4b, silicon layer 3c, and insulating film 5 are stacked on silicon substrate 1. For example, after patterning by PEP, anisotropic dry etching is performed to process the structure into a fin shape.

An impurity-doped silicon oxide film is deposited. For example, after patterning by PEP, anisotropic dry etching is performed to process the impurity-doped silicon oxide film into a staircase shape in contact with the fin-shaped stacked film (silicon oxide film layer 2, silicon layer 3a, silicon oxide film layer 4a, silicon layer 3b, silicon oxide film layer 4b, silicon layer 3c, and insulating film 5 on silicon substrate 1), as indicated by 16a in FIG. 10A.

At this time, the upper surfaces of the stairs are preferably located under the upper surfaces of silicon layers 3a, 3b and 3c, respectively.

A silicon oxide film is deposited. For example, after patterning by PEP, anisotropic dry etching is performed to process the silicon oxide film into such a shape that covers the upper surfaces of the impurity-doped silicon oxide film 16a having the staircase shape and the remaining stacked fin structure, as indicated by 15 in FIG. 10A.

At this time, the upper surfaces of silicon oxide films 15 formed on impurity-doped silicon oxide film layer 16a are preferably located under the upper surfaces of silicon oxide films 4a and 4b and insulating film 5 formed on silicon layers 3 in contact with silicon oxide films 15, respectively.

Silicon insulating film layer 15 is formed into the shape as shown in FIG. 10A. This allows to form impurity-doped silicon oxide film layer 16b later as shown in FIG. 10B only by deposition and omit the process such as PEP. It is therefore possible to reduce the manufacturing cost.

After forming the structure shown in FIG. 10B, it is heated to, for example, 1000° C. to allow solid-phase diffusion of the impurity from impurity-doped silicon oxide films 16a and 16b to silicon layers 3 that are in contact with impurity-doped silicon oxide films 16a and 16b, thereby forming impurity-doped regions 13.

Silicon oxide films 15 and impurity-doped silicon oxide films 16a and 16b are removed by, for example, anisotropic dry etching to obtain the same structure as shown in FIG. 9D.

Although the subsequent steps are not illustrated, the same procedure as that of the process described above with reference to FIGS. 4D, 4E and 4F is performed to form nonvolatile semiconductor memory 9 shown in FIGS. 1 and 8.

The same structure as in FIG. 9D can be formed from the structure shown in FIG. 10A without forming the structure shown in FIG. 10B.

After forming the structure shown in FIG. 10A, annealing is performed in a gas atmosphere containing an impurity desirable for making impurity-doped regions 13. With this process, the impurity is diffused into silicon layers 3 that are not covered by silicon oxide films 15 and impurity-doped silicon oxide film 16a. On the other hand, solid-phase diffusion of the impurity occurs from impurity-doped silicon oxide film 16a to silicon layers 3 in contact with impurity-doped silicon oxide films 16a so as to form impurity-doped regions 13.

Although not particularly illustrated, other embodiments can also be formed by partially changing the manufacturing step.

When forming the structure using the method shown in FIGS. 6A, 6B and 6C, 7A and 7B, 9A, 9B, 9C and 9D, or 10A and 10B, the positional relationship between impurity-doped regions 13 is determined by the shapes of impurity-doped silicon oxide films 16, 16a and 16b. This allows to avoid the problem that the positional relationship between the regions cannot be maintained due to the accuracy of PEP when performing patterning by PEP for ion implantation in the method shown in FIGS. 4A, 4B, 4C, 4D, 4E and 4F or 5A, 5B and 5C.

However, when processing silicon oxide film 15 and impurity-doped silicon oxide films 16, 16a and 16b into a staircase shape, height control is necessary. Hence, the difficulty increases as the number of layers increases.

In FIGS. 6A, 6B and 6C, 7A and 7B, 9A, 9B, 9C and 9D and 10A and 10B, silicon oxide film 15 and impurity-doped silicon oxide films 16, 16a and 16b are formed on both sides of the fin-shaped structure to sandwich it. The films may be formed on one side. However, when gas-phase diffusion is used, the other side needs to be covered by an arbitrary layer that does not cause unintended solid-phase diffusion to silicon layers 3.

In FIGS. 6A, 6B and 6C, 7A and 7B, 9A, 9B, 9C and 9D and 10A and 10B, a silicon oxide film is used. However, the material is not particularly limited to this, and any other material capable of causing solid-phase diffusion of an impurity is usable.

FIGS. 12A and 12B are sectional views of the nonvolatile semiconductor memory according to the embodiment.

In FIG. 12A, select transistor 11b is added to the structure shown in FIG. 8.

This structure enables to improve the cutoff characteristic of the memory strings and thus suppress an operation error. In this case, the effect is obtained by further adding select transistor 11c, as shown in FIG. 12B.

However, the memory strings become longer as the number of select transistors increases. From the viewpoint of increasing the degree of integration, adding too many select transistors is not preferable.

FIG. 13 is a sectional view of the nonvolatile semiconductor memory according to the embodiment.

Unlike the structure show in FIG. 2, each silicon layer 3 is broken off by corresponding impurity-doped region 13. In addition, insulating films 4a, 4b and 5 stacked on silicon layers 3 are broken off immediately above impurity-doped regions 13 in silicon layers 3. Silicon layer 14 is formed in the region ahead of the broken portions.

That is, silicon layers 3 are connected to each other via impurity-doped regions 13 by silicon layer (common semiconductor layer) 14 different from silicon layers 3.

In this structure, the string becomes thicker at the channel portion of the layer select transistor, and the electrical resistance decreases accordingly. Hence, layer selection speeds up as compared to the structure in FIG. 2, and the memory can operate at a higher speed.

In this example, impurity-doped region 13 in silicon layer 3c is provided in the channel of the layer select transistor closest to the memory strings so as to make the layer select transistor uncontrollable (a normally-on state).

Impurity-doped region 13 in silicon layer 3b is provided in the channel of the second layer select transistor closest to the memory strings so as to make the layer select transistor uncontrollable (a normally-on state).

Impurity-doped region 13 in silicon layer 3a is provided in the channel of the second layer select transistor farthest from the memory strings so as to make the layer select transistor uncontrollable (a normally-on state).

In other words, Impurity-doped regions 13 make the i-th layer select transistor (i is one of 1 to 3) a normally-on state in one end of the i-th semiconductor layer and make the remaining layer select transistor an on/off-controllable state in one end of the remaining semiconductor layer.

However, the order is not limited to this and may be reversed.

FIGS. 14A, 14B, 14C, 14D and 14E illustrate steps in the manufacture of the nonvolatile semiconductor memory according to the embodiment.

First, for example, p-type (first conductivity type) silicon substrate 1 having a plane orientation (100) and a resistivity of 10 to 20 Ωcm is prepared. Silicon layers and silicon oxide film layers are alternately stacked on silicon oxide film layer 2 on silicon substrate 1 by, for example, deposition in the order of silicon layer 3a, silicon oxide film layer 4a, silicon layer 3b, silicon oxide film layer 4b, and silicon layer 3c. Insulating film 5 is formed on uppermost silicon layer 3 by, for example, deposition.

For example, after patterning by PEP, anisotropic dry etching is performed to process part of the stacked film formed from silicon oxide film layer 2, silicon layer 3a, silicon oxide film layer 4a, silicon layer 3b, silicon oxide film layer 4b, silicon layer 3c, and insulating film 5 on silicon substrate 1 into a staircase shape in which each silicon layer 3 is partially exposed, as shown in FIG. 14A.

Impurity-doped regions 13 are formed in the exposed portions of silicon layers 3 by ion implantation. FIG. 14B shows this state. At this Lime, patterning by PEP may be performed to form openings in only impurity-doped regions 13, as needed.

Figure 14C:
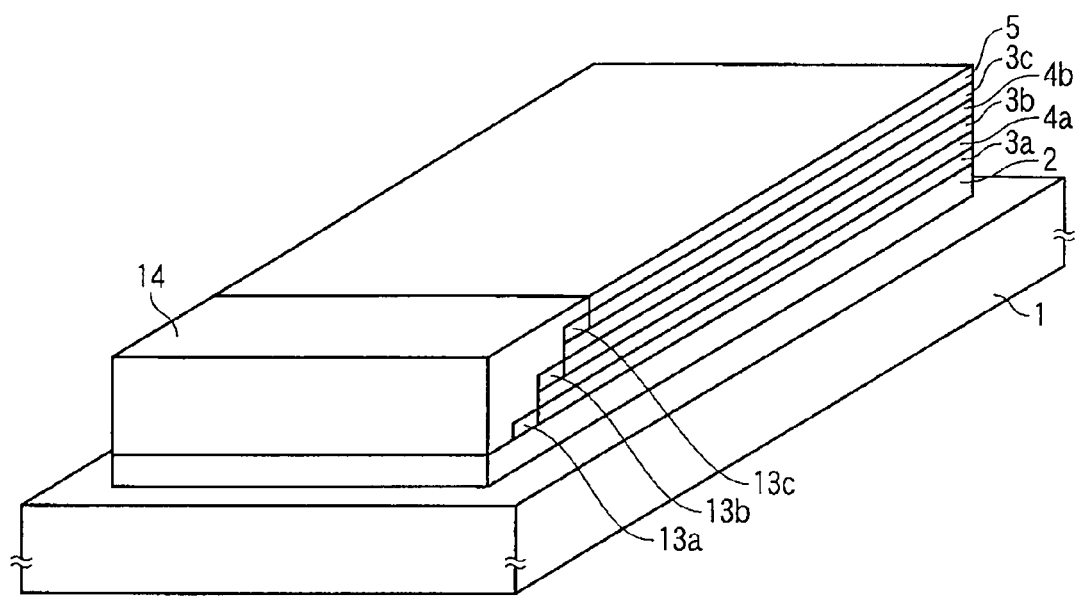

As shown in FIG. 14C, silicon is deposited and planarized by, for example, CMP, thereby forming silicon layer 14. Planarization of silicon layer 14 may also be done by dry etching.

At this time, silicon may epitaxially be grown on impurity-doped regions 13 and formed into a single-crystal state. If the silicon layer is polycrystalline, a current flows to the crystalline interfaces and degrades the off characteristic of layer select transistor 10. Hence, silicon layer 14 preferably has the single-crystal state. An insulating film may be formed on silicon layer 14 to protect it.

Figure 14D:
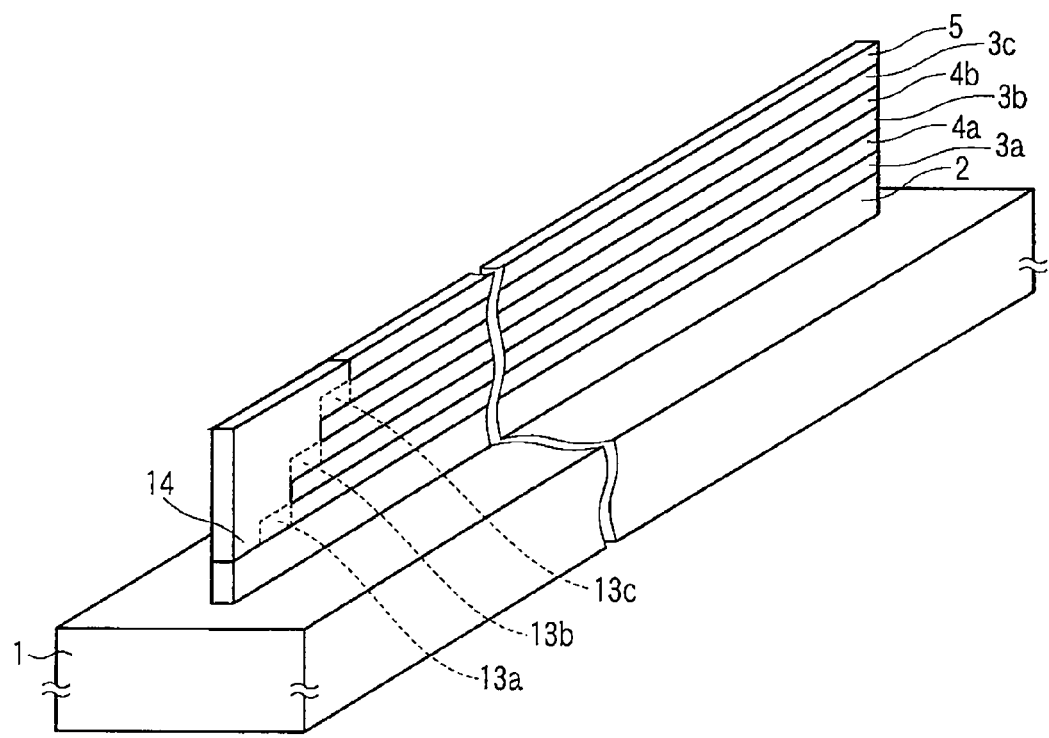

Next, for example, after patterning by PEP, anisotropic dry etching is performed to process the stacked structure shown in FIG. 14C into a fin shape as shown in FIG. 14D.

Although a detailed description will be omitted, the same procedure as that of the process described above with reference to FIGS. 4D, 4E and 4F is performed to form the structure shown in FIG. 14E and thus form nonvolatile semiconductor memory 9 in FIG. 13.

FIG. 15 is a sectional view of the nonvolatile semiconductor memory according to the embodiment.

Unlike the structure shown in FIG. 2, impurity-doped silicon 17 is formed around contact electrode 7 to the memory string.

In this embodiment, for example, assume that electrode 7 is connected to a bit line, and electrode 8 is connected to a source line. Examples of write and erase operations when impurity-doped regions 13 in silicon layers 3 and impurity-doped silicon 17 are of an $n^+$ type will be described below.

This embodiment is not limited to this. In the following embodiments, a constituent element of the p-type semiconductor may be changed to that of an n-type semiconductor, and a constituent element of the n-type semiconductor may be changed to that of a p-type semiconductor.

For the write, source line contact electrode 8 and bit line contact electrode 7 are grounded. No bias is applied to select transistor 11, and a positive bias is applied to layer select transistors 10a and 10b and control gates 6(X=1 to n)d of memory cells 6(X=1 to n), thereby generating an n-type accumulation region in each of silicon layers 3a, 3b and 3c serving as the channels of the memory strings.

Next, a large positive bias is applied to a memory cell to be write-accessed, for example, control gate 6(3)d of memory cell 6(3) to inject electrons into charge storage layer 6(3)b of memory cell 6(3), thereby performing the write.

At this time, since no bias is applied to layer select transistor 10c, memory cell 6(3) using silicon layers 3a and 3b as a channel is not write-accessed, and only memory cell 6(3) using silicon layer 3c as a channel is write-accessed.

A negative bias may be applied to control gates 6(X)d of memory cells not to be write-accessed, for example, memory cells 6(X) other than 6(3).

For erase, bit line contact electrode 7 is grounded, and a negative bias is applied to select transistor 11, layer select transistors 10a, 10b and 10c, and control gates 6(X=1 to n)d of memory cells 6(X=1 to n), thereby generating a p-type accumulation region in each of silicon layers 3a, 3b and 3c serving as the channels of the memory strings.

Next, a large negative bias is applied to a memory cell to be erased, for example, control gate 6(2)d of memory cell 6(2) to inject holes into charge storage layer 6(2)b of memory cell 6(2), thereby performing the erase.

At this time, a positive bias may be applied to control gates 6(X)d of memory cells 6(X) not to be erased, for example, memory cells 6(X) other than memory cell 6(2).

For read, like a normal NAND flash memory, source line contact electrode 7 is grounded, and a positive bias is applied to bit line contact electrode 8 so as to apply the positive bias to for example, control gates 6(X)d of memory cells 6(X) except a memory cell to be read-accessed, for example, memory cell 6(1). Based on whether a current flows, "0" or "1" information is read.

In this case as well, the stacked memory string can be selected and read-accessed by the method of applying a bias to layer select transistors 10a, 10b and 10c.

Out of the above-described operations, the write and erase can be done as in this embodiment even for the structure in FIG. 2 which has the impurity region 17 on neither source line contact electrode 8 nor bit line contact electrode 7. However, the source resistance generated by the Schottky battier may considerably decrease the current flowing at the time of read. Since such a Schottky battier poses no problem on the drain region side, the above-described problem does not arise in this embodiment.

In this embodiment, the same effect as described above can be obtained even when electrode 8 is made of a metal material, and electrode 7 is made of impurity-doped silicon. In this case, impurity-doped silicon 17 need not be formed around electrode 7.

Figure 16B:
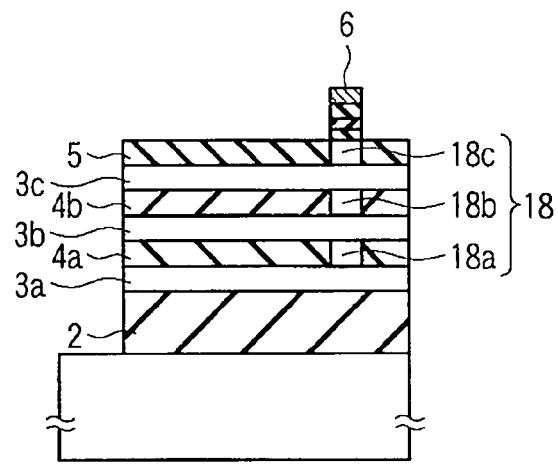
FIG. 16B is a sectional view taken along a line C-C in FIG. 16A.

FIGS. 16A and 16B are schematic views particularly showing silicon layers 3 surrounded by stacked film 6 in nonvolatile semiconductor memory 9 according to the embodiment.

Silicon layers 3a, 3b and 3c have air gaps 18a, 18b and 18c, respectively, in the portions surrounded by stacked film 6. Air gaps 18a, 18b and 18c are formed in insulating films 4a, 4b and 5, respectively.

Air gaps 18a, 18b and 18c may be formed not only in the portions surrounded by stacked film 6 but also in the portions surrounded by layer select transistors 10 and select transistor 11. Air gaps 18a, 18b and 18c may spread all over between silicon layers 3a, 3b and 3c.

In this case, the resistivity between silicon layers 3a, 3b and 3c lowers. Hence, the same insulating characteristic can be obtained even when the interval between the silicon layers is reduced. As a result, the interval between silicon layers 3a, 3b and 3c can be reduced, and the degree of integration can be increased.

FIGS. 18A, 18B, 18C, 18D, 18E, 18F, 18G and 18H illustrate steps in the manufacture of the nonvolatile semiconductor memory according to the embodiment and, more particularly, a step of forming insulating layers 18 including air gaps in silicon layers 3.

These drawings correspond to a section taken along a line B-B in FIG. 1.

First, as shown in FIG. 18A, for example, p-type (first conductivity type) silicon substrate 1 having a plane orientation (100) and a resistivity of 10 to 20 Ω·cm is prepared. Silicon layers 3 and silicon germanium layers 104 are alternately stacked in the order of 3a, 104a, 3b, 104b and 3c on silicon germanium layer (SiGe) 102 on silicon substrate 1.

At this time, since silicon and silicon germanium can epitaxially grow a crystalline film that is deposited while maintaining the crystallographic orientation relationship with respect to silicon substrate 1. Hence, silicon layers 3 and silicon germanium layers 104 can be formed as a single crystal. Insulating film 5 is formed on uppermost silicon layer 3 by, for example, deposition. FIG. 18B illustrates this state.

For example, after patterning by PEP, anisotropic dry etching is performed to process the stacked structure including silicon germanium layer 102, silicon layer 3a, silicon germanium layer 104a, silicon layer 3b, silicon germanium layer 104b, silicon layer 3c, and insulating film 5 on silicon substrate 1 into a strip shape as shown in FIG. 18C.

As shown in FIG. 18D, silicon germanium layer 102, silicon layer 3a, silicon germanium layer 104a, silicon layer 3b, silicon germanium layer 104b, silicon layer 3c, and insulating film 5, which are processed into a strip shape, undergo, for example, thermal oxidation to form silicon oxide film 106a.

At this time, silicon germanium oxide films are formed on silicon germanium layers 102 and 104. Silicon oxide film 106a can also be formed by deposition. Not the silicon oxide film but a tunnel insulating film material necessary for a nonvolatile semiconductor memory of each generation may selectively be used as needed.

Next, charge storage layer 106b, insulating film 106c, and electrode 106d are deposited, as shown in FIG. 18E.

As shown in FIG. 18F, for example, after patterning by PEP, anisotropic dry etching is performed for silicon oxide film 106a, charge storage layer 106b, insulating film 106c, and electrode 106d to form stacked films 6(X) shown in FIG. 1 which are electrically insulated.

As shown in FIG. 18G, for example, anisotropic dry etching is performed to selectively remove only silicon germanium layers 102 and 104.

FIG. 18F illustrates silicon germanium layers 102 and 104 wholly surrounded by stacked film 6(X). In fact, the layers of stacked film 6(X) have gaps therebetween, and silicon germanium layers 102 and 104 are etched from the gaps.

Next, as shown in FIG. 18H, for example, a silicon oxide film is deposited on the entire structure to form silicon oxide film 2 and silicon oxide films 4 in the regions where silicon germanium layers 102 and 104 have been removed. Not all the regions of silicon oxide film 2 and silicon oxide films 4 need be formed from the silicon oxide film. Some or all the regions may be air gaps without the silicon oxide film.

When, for example, a silicon oxide film having a poor filling property is deposited, the gaps surrounded by stacked film 6(X), layer select transistors 10, and select transistor 11 are not preferentially filled so that insulating layers 18a, 18b and 18c including air gaps are formed.

Although the subsequent steps are not illustrated, for example, after patterning by PEP, anisotropic dry etching is performed to form hole patterns in regions where electrodes 7 and 8 should be formed.

After that, for example, tungsten is deposited. CMP is then performed for the tungsten outside the hole patterns to form electrodes 7 and 8. Nonvolatile semiconductor memory 9 including insulating layers 18 shown in FIGS. 16A and 16B is thus formed.

Figure 17:
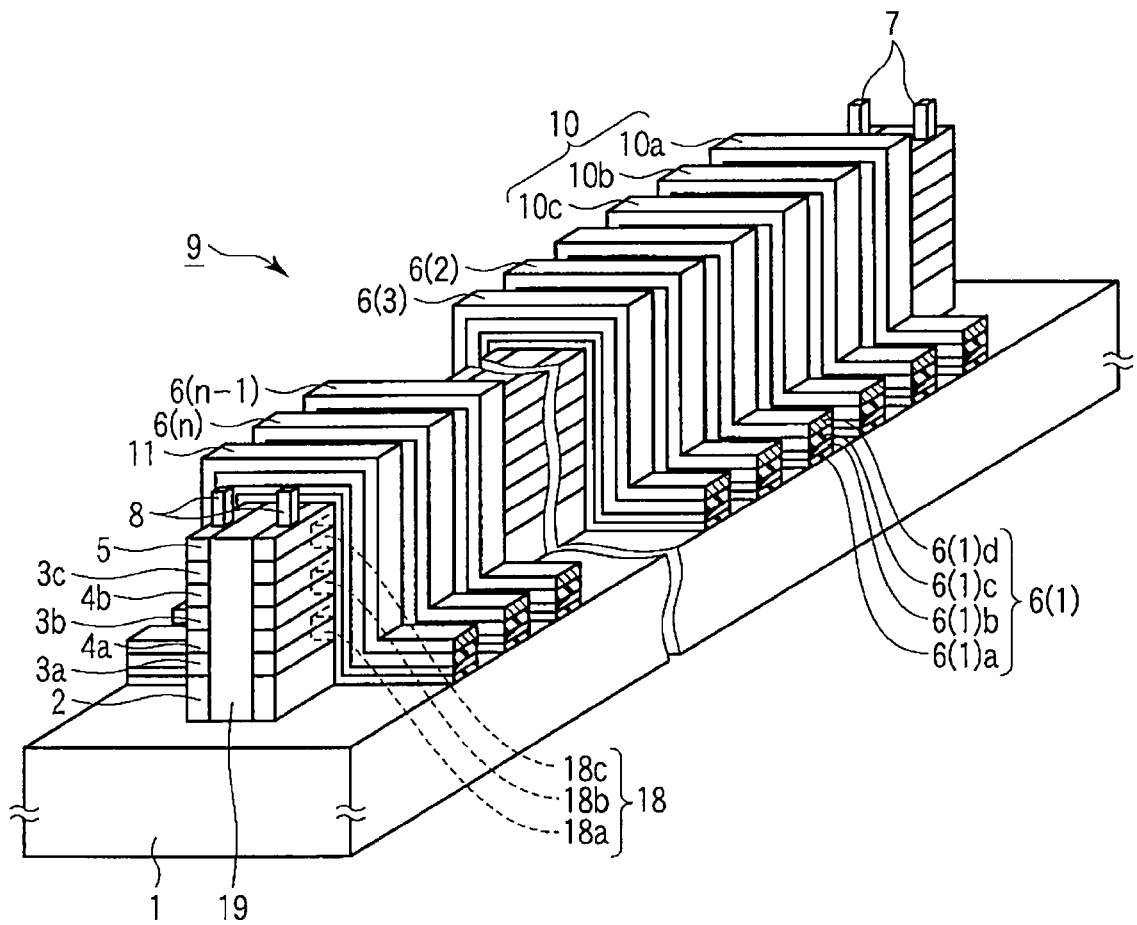
FIG. 17 is a perspective view showing the structure according to the embodiment.

FIG. 17 is a schematic perspective view of nonvolatile semiconductor memory 9 according to the embodiment.

Erase electrode 19 is formed between two fin structures each formed from a stacked structure including silicon oxide film layer 2, silicon layer 3a, silicon oxide film layer 4a, silicon layer 3b, silicon oxide film layer 4b, silicon layer 3c, and insulating film 5 on silicon substrate 1. In the erase operation of a memory cell formed from stacked film 6(X), a bias is applied to erase electrode 19, thereby injecting holes into charge storage layer 6(X) and operating the device.

Insulating layers 18 including air gaps shown in FIGS. 16A and 16B are provided. In this case, upon applying a bias to erase electrode 19, the fringe electric field from erase electrode 19 to insulating layers 18 weakens, and the electric field concentrates to each silicon layer 3. This allows to improve the erase characteristic.

(Modification)

Note that the embodiments are not limited to those described above, and they may partially be combined without departing from the scope of the embodiments.

The formation methods of the embodiments are not limited either. For example, a formation method including epitaxial growth of SiGe and Si shown in FIG. 18 may be used for the purpose of forming a channel by an Si single crystal.

Forming a channel by an Si single crystal allows to earn the cell current value and also form a tunnel film on the single-crystal silicon by the thermal oxidation process. For this reason, the nonvolatile semiconductor memory is expected to improve its characteristics such as the write and holding characteristics.

In the embodiment, silicon is used as the substrate. Instead, another substrate such as a germanium substrate may be used.

No description has been done concerning the diffusion layer regions in silicon layers 3 between memory cells, select transistor 11, and layer select transistors 10a, 10b, and 10c formed from stacked film 6(X). Necessary diffusion layers are formed as needed.

For example, when a voltage is applied to electrode 6(X)d, the electric field (fringe electric field) is applied not only to the layers immediately under stacked film 6(X) but also to silicon layers 3 between stacked films 6(X). If the gate interval (the interval between stacked films 6(X)) is as short as, for example, 30 nm or less, a current path is formed through the channel only by the fringe electric field (for example, Chang-Hyum Lee, et al, VLSI Technology Digest of Technical Papers, pp. 118-119, 2008). Hence, the diffusion layers need not always be formed.

In addition, various changes and modifications can be done without departing from the scope of the embodiments.

(Effects)

According to the embodiment, employing the layer select transistor structure allows the stacked strings to share one source line and one bit line. Even when the memory strings are stacked, the memory string length increases only in the region where layer select transistors are formed in each layer. Hence, the memory strings can be shortened as compared to the conventional structure. In addition, the increase in the number of interconnections and the circuit area can be suppressed to an amount corresponding to one additional layer select transistor in each layer.

The embodiment has large industrial advantages for a file memory capable of high-speed random write, a portable terminal capable of high-speed download, a portable player capable of high-speed download, a semiconductor memory for broadcast equipment, a drive recorder, a home video recorder, a mass buffer memory for communication, a semiconductor memory for surveillance camera, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
   a semiconductor substrate;
   first to n-th (n is a natural number not less than 2) semiconductor layers which are stacked in order from the semiconductor substrate side in a first direction perpendicular to a surface of the semiconductor substrate and extend in a second direction parallel to the surface of the semiconductor substrate, and the semiconductor layers isolated each other and having a stair case pattern in a first end of the first to n-th semiconductor layers in the second direction;
   a common semiconductor layer connected to the first to n-th semiconductor layers commonly in the first end of the first to n-th semiconductor layers, the common semiconductor layer having an upper surface higher than an upper surface of the n-th semiconductor layer;
   a first electrode connected to the common semiconductor layer;
   a second electrode connected to the first to n-th semiconductor layers in a second end of the first to n-th semiconductor layers in the second direction;
   first to n-th memory strings which are provided in corresponding to the first to n-th semiconductor layers, channels of the first to n-th memory strings being provided in the first to n-th semiconductor layers respectively;
   first to n-th layer select transistors which are provided in order from the first electrode side between the first electrode and the first to n-th memory strings, and select one of the first to n-th memory strings; and
   first to n-th impurity regions which are provided in the first to n-th semiconductor layers adjacent to the common semiconductor layer respectively,
   wherein the i-th layer select transistor (i is one of 1 to n) comprises first to n-th sub transistors which are provided in order from the first semiconductor layer between the first semiconductor layer and the upper surface of the common semiconductor layer,
   the i-th sub transistor of the i-th layer select transistor comprises the i-th impurity region as a channel which is provided in the i-th semiconductor layer, and
   the i-th impurity region has an impurity concentration higher than an impurity concentration of a channel of the sub transistor except the i-th sub transistor among the first to n-th sub transistors of the i-th layer select transistor.

2. The memory of claim 1, wherein the first to n-th memory strings comprise memory cells connected in series in the second direction.

3. The memory of claim 2, wherein each of the memory cells comprises a first insulating film, a charge storage layer, a second insulating film, and a control gate electrode stacked in a third direction perpendicular to the first and second directions.

4. The memory of claim 3, wherein the control gate electrode extends to the first direction along a surface of the first to n-th semiconductor layers.

5. The memory of claim 1, wherein each of first to n-th layer select transistors comprises a gate insulating film and a select gate electrode stacked in a third direction perpendicular to the first and second directions.

6. The memory of claim 5, wherein the select gate electrode extends to the first direction along a surface of the first to n-th semiconductor layers.

7. The memory of claim 1, wherein each of first to n-th layer select transistors comprises a first insulating film, a charge storage layer, a second insulating film and a select gate electrode stacked in a third direction perpendicular to the first and second directions.

8. The memory of claim 7, wherein the select gate electrode extends to the first direction along a surface of the first to n-th semiconductor layers.

9. The memory of claim 1, further comprising a select transistor which is provided between the second electrode and the first to n-th memory strings.

10. The memory of claim 1, wherein the first to n-th semiconductor layers are electrically isolated by insulating layers.

11. The memory of claim 1, wherein the first to n-th semiconductor layers are electrically isolated by air gaps.

12. The memory of claim 1, wherein the first to n-th impurity regions include at least one of p-type impurities and n-type impurities.

13. The memory of claim 1, wherein the first and second electrodes include one of tungsten and aluminum.

14. The memory of claim 1, further comprising:
    impurity regions provided around the first and second electrodes.

15. The memory of claim 3, wherein the first insulating film comprises a material selected from silicon oxide and silicon oxynitride, or the material including one of silicon nanoparticles and metal ions.

16. The memory of claim 3, wherein the charge storage layer comprises a material selected from hafnium oxide and silicon nitride, or the material including one of silicon nanoparticles and metal ions.

17. The memory of claim 3, wherein the second insulating film comprises a material selected from silicon oxide, aluminum oxide, lanthanum aluminum oxide, and lanthanum aluminum silicon oxide.

18. The memory of claim 3, wherein the control gate electrode comprises a material selected from nickel silicide, tantalum nitride, tantalum carbide, and titanium nitride.

19. The memory of claim 6, wherein the first to n-th semiconductor layers and the common semiconductor layer comprise a fin-type stacked structure.

20. The memory of claim 1, further comprising an erase electrode which is provided on a surface of the first to n-th semiconductor layers, and to which a bias is applied in an erase operation.

21. A method of manufacturing the memory of claim 1, the method comprising:
    forming the first to n-th semiconductor layers having the stair case pattern in the first end in the second direction;
    forming the first to n-th impurity regions in the first end of the first to n-th semiconductor layers by using an ion implantation;
    forming the common semiconductor layer connected to the first to n-th semiconductor layers commonly in the first end of the first to n-th semiconductors;
    forming a fin-type stacked structure by patterning the first to n-th semiconductor layers and the common semiconductor layer; and
    forming the first to n-th memory strings and the first to n-th layer select transistors on the fin-type stacked structure.

22. The memory of claim 1, wherein the impurity concentration of the i-th impurity region is higher than an impurity concentration of the common semiconductor layer.

23. The memory of claim 1, wherein the upper surface of the common semiconductor layer is flat.

* * * * *